United States Patent
Blanksby et al.

(10) Patent No.: US 8,341,488 B2
(45) Date of Patent: Dec. 25, 2012

(54) ACCUMULATING LDPC (LOW DENSITY PARITY CHECK) DECODER

(75) Inventors: Andrew J. Blanksby, Neptune, NJ (US); Alvin Lai Lin, Londonderry (GB)

(73) Assignee: Broadcom Corporation, Irvine, CA (US)

(*) Notice: Subject to any disclaimer, the term of this patent is extended or adjusted under 35 U.S.C. 154(b) by 750 days.

(21) Appl. No.: 12/512,490

(22) Filed: Jul. 30, 2009

(65) Prior Publication Data

US 2010/0031118 A1 Feb. 4, 2010

Related U.S. Application Data

(60) Provisional application No. 61/086,081, filed on Aug. 4, 2008, provisional application No. 61/086,097, filed on Aug. 4, 2008.

(51) Int. Cl.
*H03M 13/00* (2006.01)

(52) U.S. Cl. ........ 714/755; 375/262; 375/341; 714/786; 714/794

(58) Field of Classification Search .................. 714/755, 714/786, 752, 758, 763, 780, 792, 794–795; 375/262, 341
See application file for complete search history.

(56) References Cited

U.S. PATENT DOCUMENTS

| | | | | |
|---|---|---|---|---|
| 7,669,109 | B2* | 2/2010 | Hocevar | 714/780 |
| 2004/0255229 | A1* | 12/2004 | Shen et al. | 714/792 |
| 2005/0283707 | A1* | 12/2005 | Sharon et al. | 714/758 |
| 2008/0222487 | A1* | 9/2008 | Matsumoto | 714/758 |

OTHER PUBLICATIONS

R. Gallagher, Low-Density Parity-Check Codes, Cambridge, MA: MIT Press, 1963.
R. G. Gallagher, "Low density parity check codes," IRE Trans. Info. Theory, vol. IT-8, Jan. 1962, pp. 21-28.
M. G. Luby, M. Mitzenmacher, M. A. Shokrollahi, D. A. S Pielman, and V. Stemann, "Practical Loss-Resilient Codes," Proc. 29th Symp. on Theory of Computing, 1997, pp. 150-159.
T. J. Richardson and R. L. Urbanke, "The capacity of low-density parity-check code under message-passing decoding," IEEE Trans. Inform. Theory, vol. 47, No. 2, Feb. 2001, pp. 599-618.
Anastasopoulos, A., "A comparison between the sum-product and the min-sum iterative detection algorithms based on density evolution," IEEE Global Telecommunications Conference, vol. 2, No. 25-29, Nov. 2001, pp. 1021-1025.
Hocevar, D.E., "A reduced complexity decoder architecture via layered decoding of LDPC codes," IEEE Workshop on Signal Processing Systems, 2004, pp. 107-112.

(Continued)

*Primary Examiner* — Guy Lamarre
(74) *Attorney, Agent, or Firm* — Garlick & Markison; Shayne X. Short

(57) ABSTRACT

Accumulating LDPC (Low Density Parity Check) decoder. The accumulating decoding architecture described herein is applicable to LDPC codes operating on a parity check matrix, H, consisting of CSI (Cyclic Shifted Identity) sub-matrices (or matrix sub-blocks) or permuted identity sub-matrices (or matrix sub-blocks). In such a structure, the entire LDPC matrix is broken into square sub-matrices such that each sub-matrix consists of either a CSI sub-matrix or a permuted identity sub-matrix, or a null matrix. The iterative decoding process operates by updating of APP (a posteriori probability) or gamma ($\gamma$) values and check edge message ($\lambda$) values, and this by updating one or more individual rows within a number of sub-matrix rows (or all sub-matrix or sub-block rows) are processed in parallel. The amount of parallelism is specified by the designer and is typically an integer divisor of the sub-matrix (or sub-block) size.

20 Claims, 15 Drawing Sheets

OTHER PUBLICATIONS

Karkooti, M., and Cavallaro, J.R., "Semi-parallel reconfigurable architectures for real-time LDPC decoding," Proceedings of the International Conference on Information Technology: Coding and Computing, vol. 1, 2004, pp. 579-585.

Mansour, M.M., and Shanbhag, N.R., "Low-power VLSI decoder architectures for LDPC codes," Proceedings of the 2002 International Symposium on Low Power Electronics and Design, 2002, pp. 284-289.

* cited by examiner

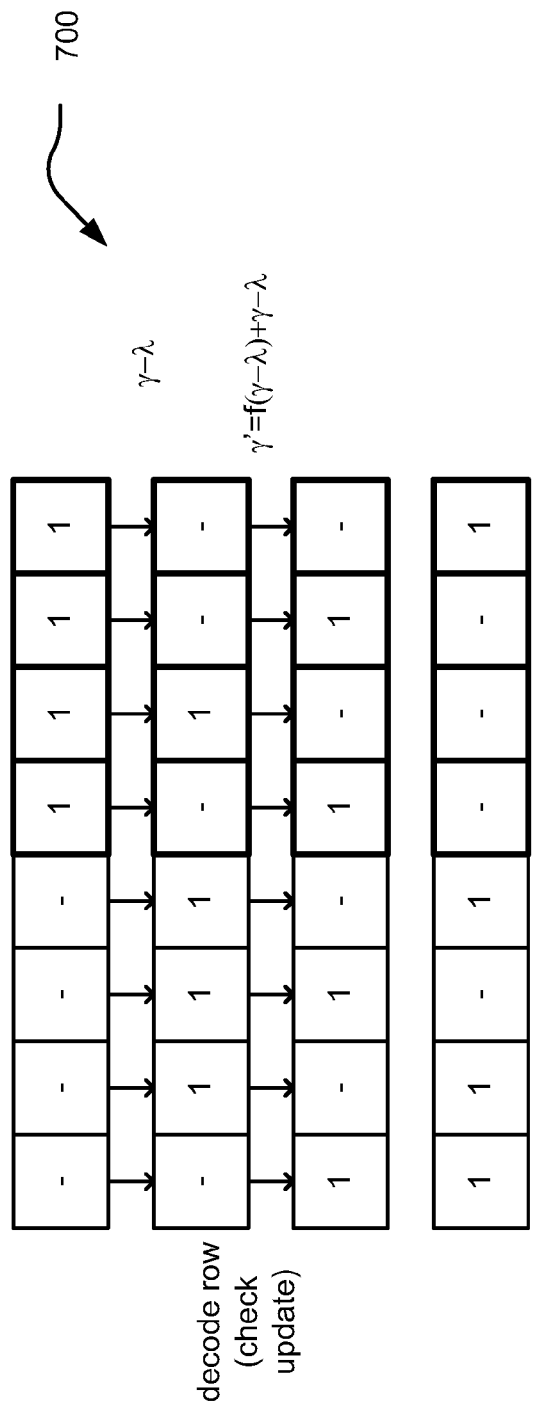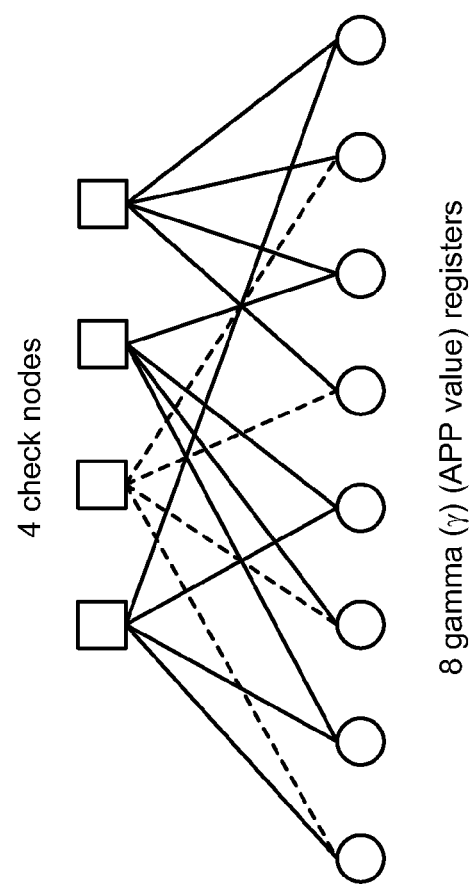
Fig. 7

Fig. 8 (layered, Z check modules, one sub-matrix row per cycle)

Fig. 9 (accumulating, $W_c$ check modules)

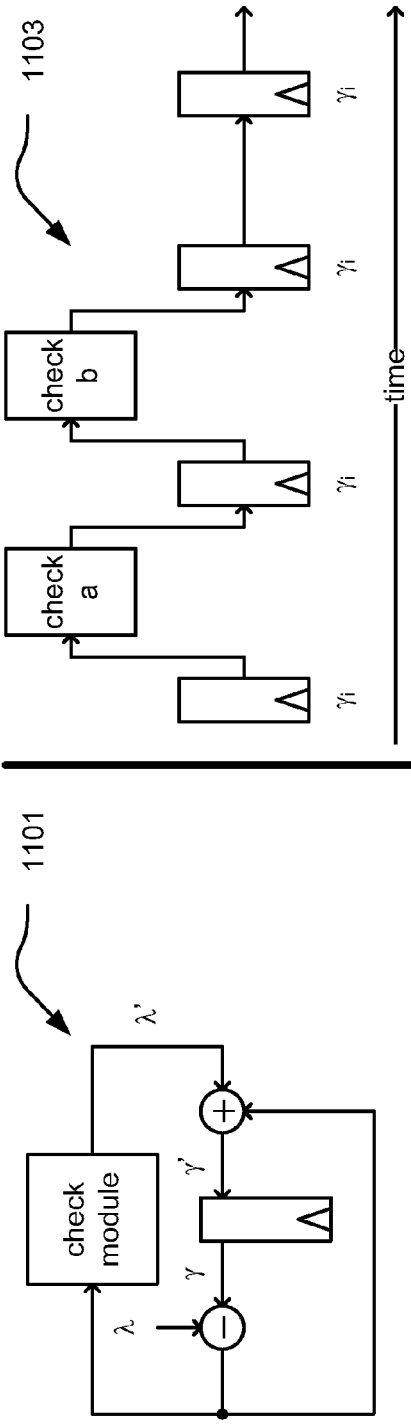
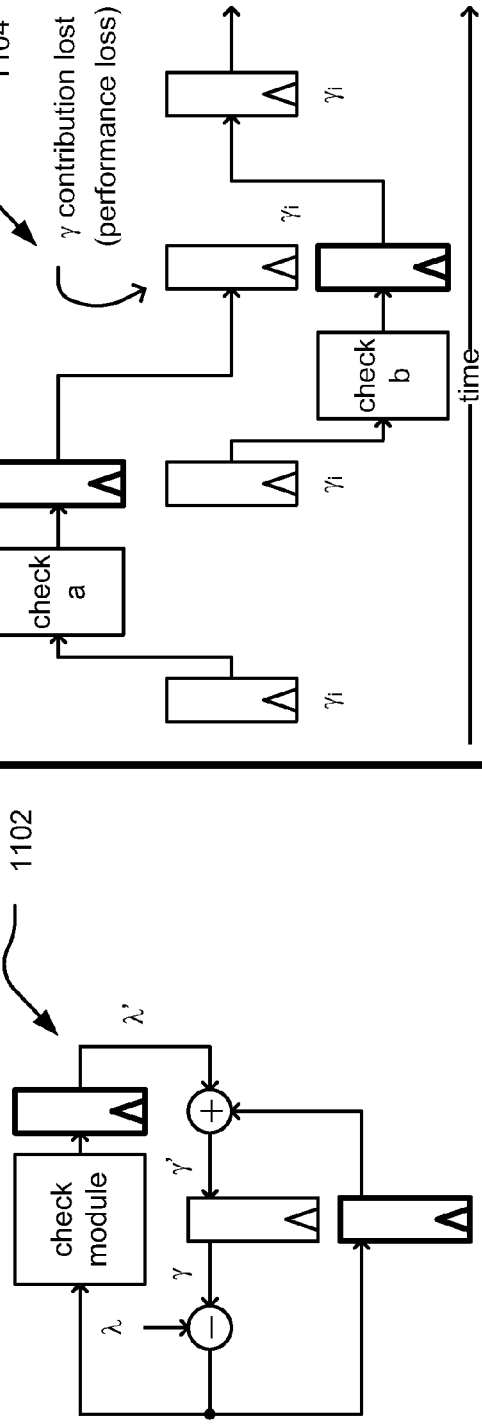

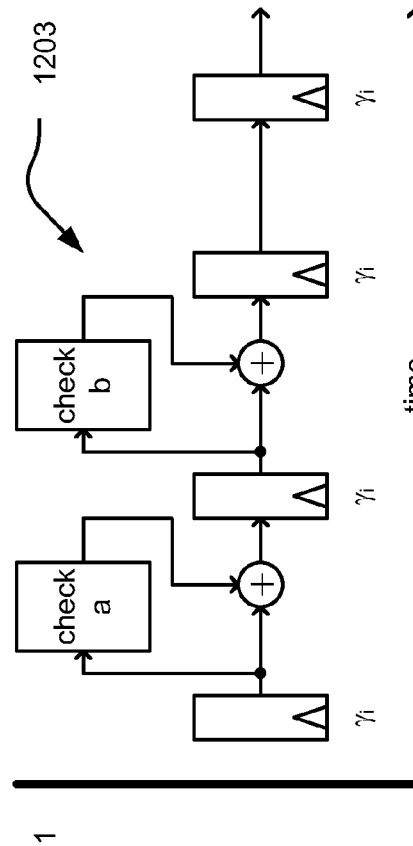
Fig. 12A (accumulating)
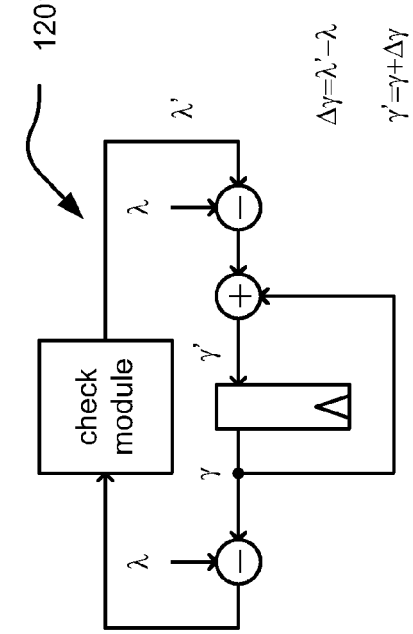
Fig. 12B (pipeline/accumulating)
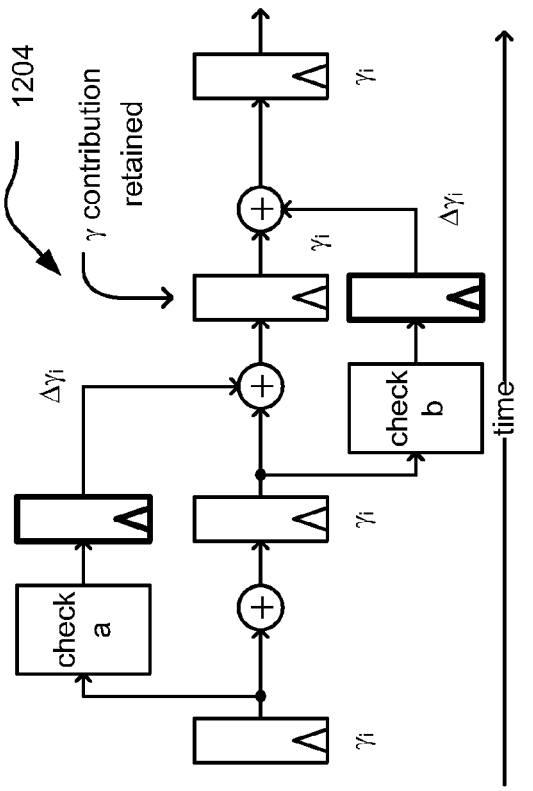
Fig. 12C (consecutive γ update OK)
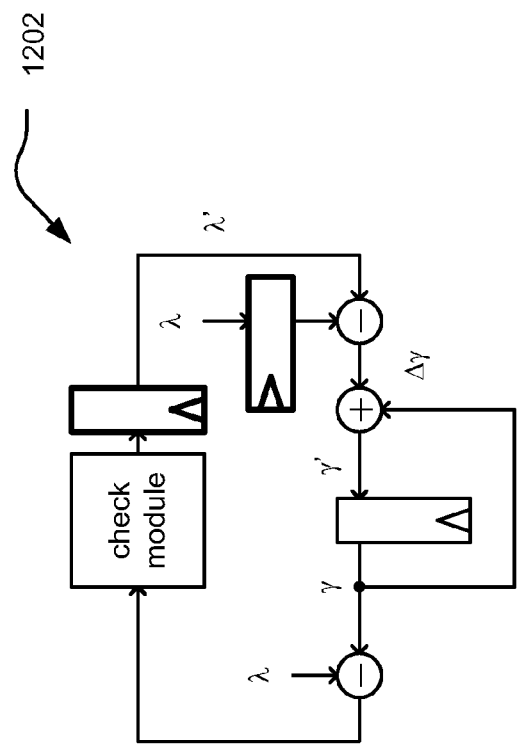
Fig. 12D (retains each Δγ portion)

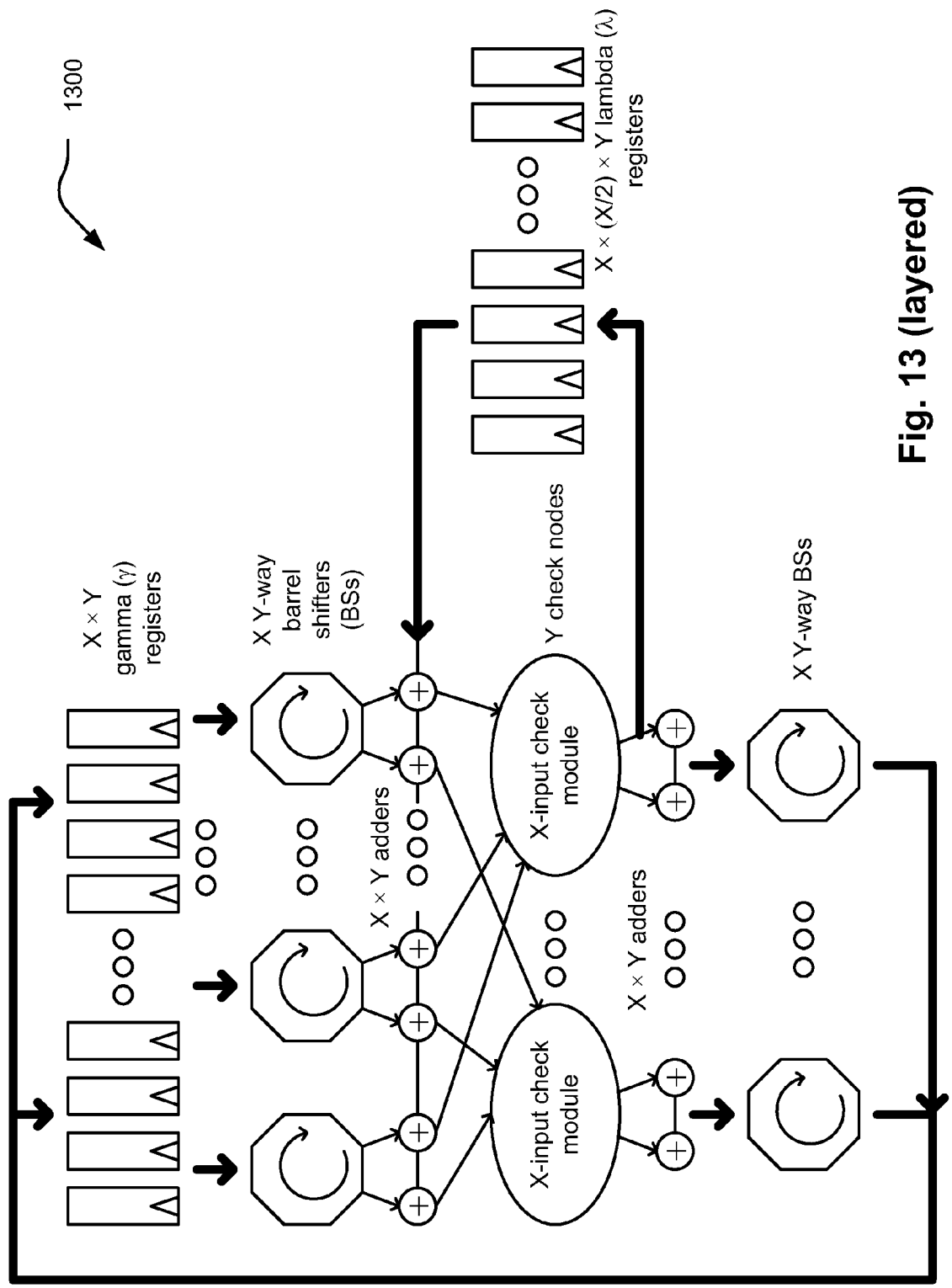
Fig. 13 (layered)

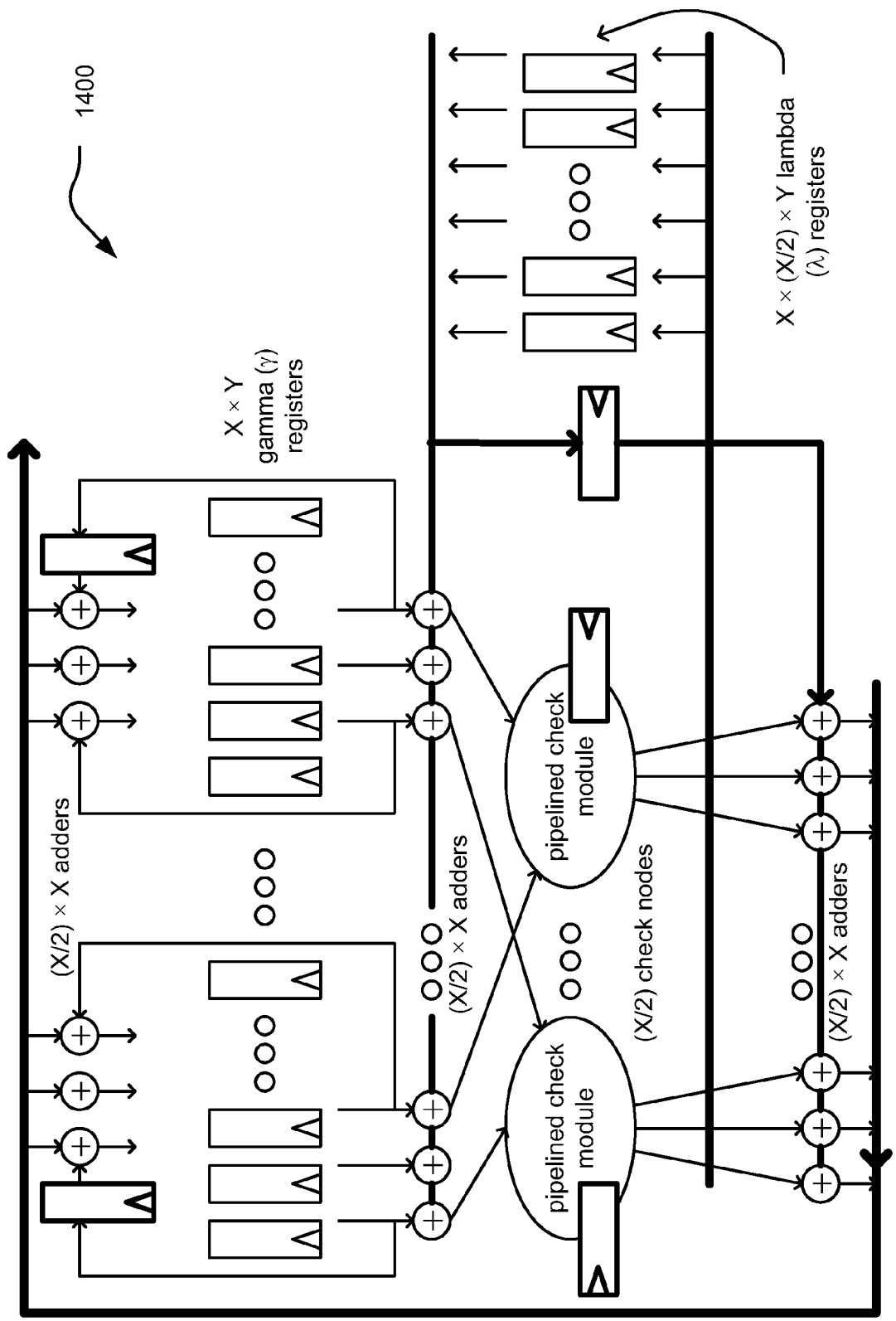
Fig. 14 (pipeline/accumulating)

ACCUMULATING LDPC (LOW DENSITY PARITY CHECK) DECODER

CROSS REFERENCE TO RELATED PATENTS/PATENT APPLICATIONS

Provisional Priority Claims

The present U.S. Utility patent application claims priority pursuant to 35 U.S.C. §119(e) to the following U.S. Provisional patent applications which are hereby incorporated herein by reference in their entirety and made part of the present U.S. Utility patent application for all purposes:

1. U.S. Provisional Application Ser. No. 61/086,081, entitled "Accumulating LDPC (Low Density Parity Check) decoder," filed Aug. 4, 2008.

2. U.S. Provisional Application Ser. No. 61/086,097, entitled "Permuted accelerated LDPC (Low Density Parity Check) decoder," filed Aug. 4, 2008.

Incorporation by Reference

The following U.S. Utility patent applications are hereby incorporated herein by reference in their entirety and made part of the present U.S. Utility patent application for all purposes:

1. U.S. Utility patent application Ser. No. 11/828,532, entitled "Distributed processing LDPC (Low Density Parity Check) decoder," filed Jul. 26, 2007, which claims priority pursuant to 35 U.S.C. §119(e) to the following U.S. Provisional patent application which is hereby incorporated herein by reference in its entirety and made part of the present U.S. Utility patent application for all purposes:

a. U.S. Provisional Application Ser. No. 60/958,014, entitled "Distributed processing LDPC (Low Density Parity Check) decoder," filed Jul. 2, 2007.

2. U.S. Utility patent application Ser. No. 11/843,553, entitled "Multi-code LDPC (Low Density Parity Check) decoder," filed Aug. 22, 2007, pending, which claims priority pursuant to 35 U.S.C. §119(e) to the following U.S. Provisional patent applications which are hereby incorporated herein by reference in their entirety and made part of the present U.S. Utility patent application for all purposes:

a. U.S. Provisional Application Ser. No. 60/958,014, entitled "Distributed processing LDPC (Low Density Parity Check) decoder," filed Jul. 2, 2007.

b. U.S. Provisional Application Ser. No. 60/954,182, entitled "Multi-code LDPC (Low Density Parity Check) decoder," filed Aug. 6, 2007.

3. U.S. Utility patent application Ser. No. 12/512,820, entitled "Permuted accelerated LDPC (Low Density Parity Check) decoder," filed concurrently on Jul. 30, 2009

BACKGROUND OF THE INVENTION

1. Technical Field of the Invention

The invention relates generally to hardware architecture for use in processing a coded signal to make estimates of information bits encoded therein; and, more particularly, it relates to hardware architecture for use in processing LDPC (Low Density Parity Check) coded signal to make estimates of information bits encoded therein.

2. Description of Related Art

Data communication systems have been under continual development for many years. One such type of communication system that has been of significant interest lately is a communication system that employs iterative error correction codes (ECCs). Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code with a length of one million, it nevertheless demonstrates the very promising application of LDPC codes within communication systems.

The use of LDPC coded signals continues to be explored within many newer application areas. Some examples of possible communication systems that may employ LDPC coded signals include communication systems employing 4 wire twisted pair cables for high speed Ethernet applications (e.g., 10 Gbps (Giga-bits per second) Ethernet operation according to the IEEE 802.3an (10GBASE-T) emerging standard) as well as communication systems operating within a wireless context (e.g., in the IEEE 802.11 context space including the IEEE 802.11n emerging standard).

For any of these particular communication system application areas, near-capacity achieving error correction codes are very desirable. The latency constraints, which would be involved by using traditional concatenated codes, simply preclude their use in such applications in very high data rate communication system application areas.

Generally speaking, within the context of communication systems that employ LDPC codes, there is a first communication device at one end of a communication channel with encoder capability and second communication device at the other end of the communication channel with decoder capability. In many instances, one or both of these two communication devices includes encoder and decoder capability (e.g., within a bi-directional communication system). LDPC codes can be applied in a variety of additional applications as well, including those that employ some form of data storage (e.g., hard disk drive (HDD) applications and other memory storage devices) in which data is encoded before writing to the storage media, and then the data is decoded after being read/retrieved from the storage media.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 7 illustrates an embodiment of sub-matrix based decoding of an LDPC coded signal using APP (a posteriori probability) (or gamma ($\gamma$)) and check edge message ($\lambda$) updating.

FIG. 11A illustrates an embodiment of layered decoding of an LDPC coded signal.

FIG. 11B illustrates an embodiment of pipelined layered decoding of an LDPC coded signal.

FIG. 11C illustrates an embodiment of layered decoding of an LDPC coded signal in which consecutive APP (a posteriori probability) (or gamma ($\gamma$)) update occurs properly.

FIG. 11D illustrates an embodiment of pipelined layered decoding of an LDPC coded signal in which contributions of various consecutive APP (a posteriori probability) (or gamma ($\gamma$)) updates are lost.

FIG. 12A illustrates an embodiment of accumulating decoding of an LDPC coded signal.

FIG. 12B illustrates an embodiment of pipelined accumulating decoding of an LDPC coded signal.

FIG. 12C illustrates an embodiment of accumulating decoding of an LDPC coded signal in which consecutive APP (a posteriori probability) (or gamma ($\gamma$)) update occurs properly.

FIG. 12D illustrates an embodiment of pipelined accumulating decoding of an LDPC coded signal in which contributions of various consecutive APP (a posteriori probability) (or gamma ($\gamma$)) updates are properly retained.

FIG. 13 illustrates an embodiment of layered decoding of an LDPC coded signal in which an entire sub-matrix row is processed every decoding cycle.

FIG. 14 illustrates an embodiment of pipelined/accumulating decoding of an LDPC coded signal in which multiple rows from various sub-matrix rows are processed every decoding cycle.

DETAILED DESCRIPTION OF THE INVENTION

Communication systems have been around for some time, and their presence into modern life is virtually ubiquitous (e.g., television communication systems, telecommunication systems including wired and wireless communication systems, etc.). As these communication systems continue to be developed, there is an ever present need for designing various means by which information may be encoded for transmitting from a first location to a second location. In accordance with this, error correction codes (ECCs) are a critical component in ensuring that the information received at the second location is actually the information sent from the first location. LDPC (Low Density Parity Check) codes are one such type of ECC that can be employed within any of a variety of communication systems.

It is noted that any of the following embodiments and approaches described herein are applicable regardless of any overall LDPC decoder architecture which may be employed, e.g., whether fully parallel, partially parallel, or serial in a particular architecture/hardware implementation.

Figure 1:
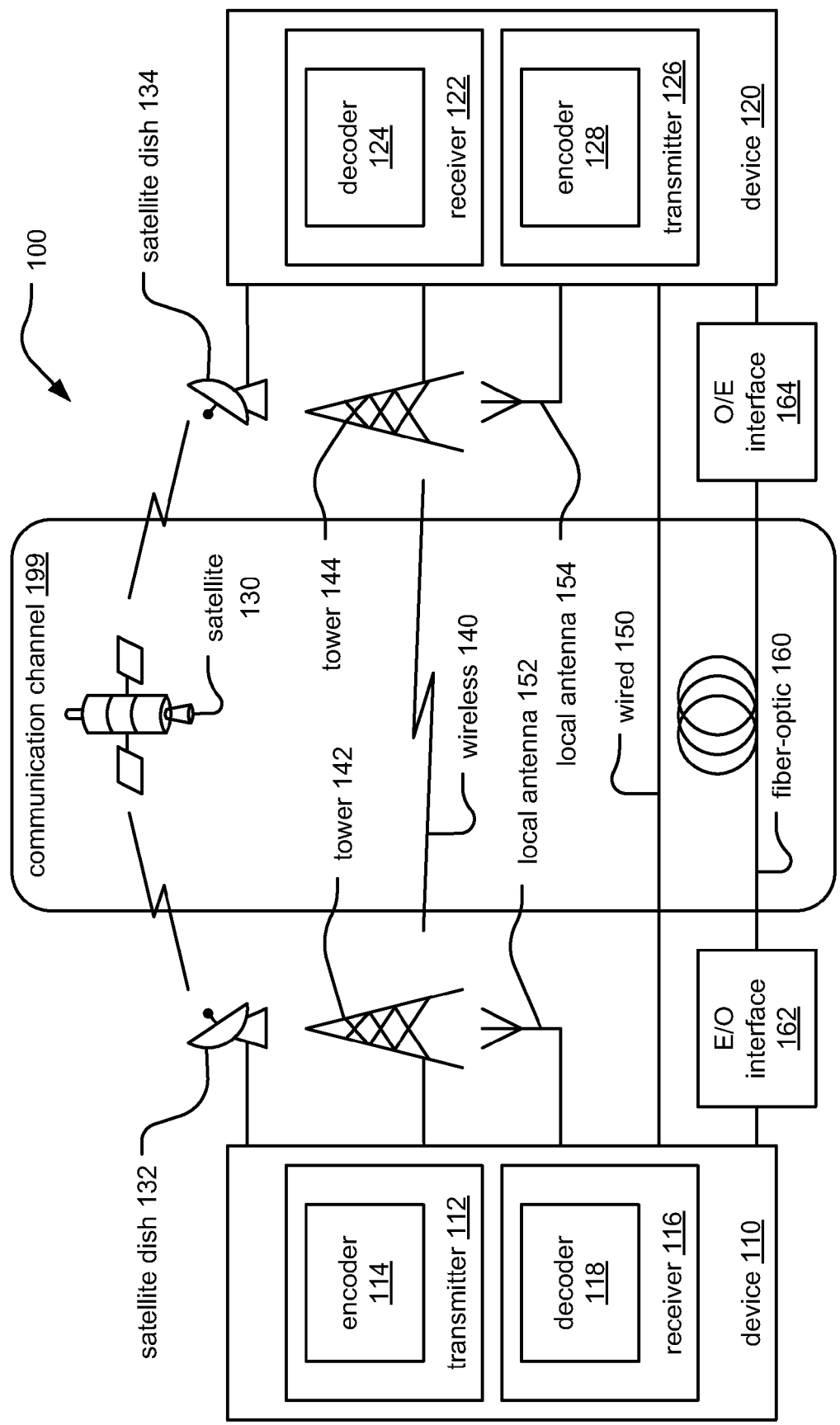
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
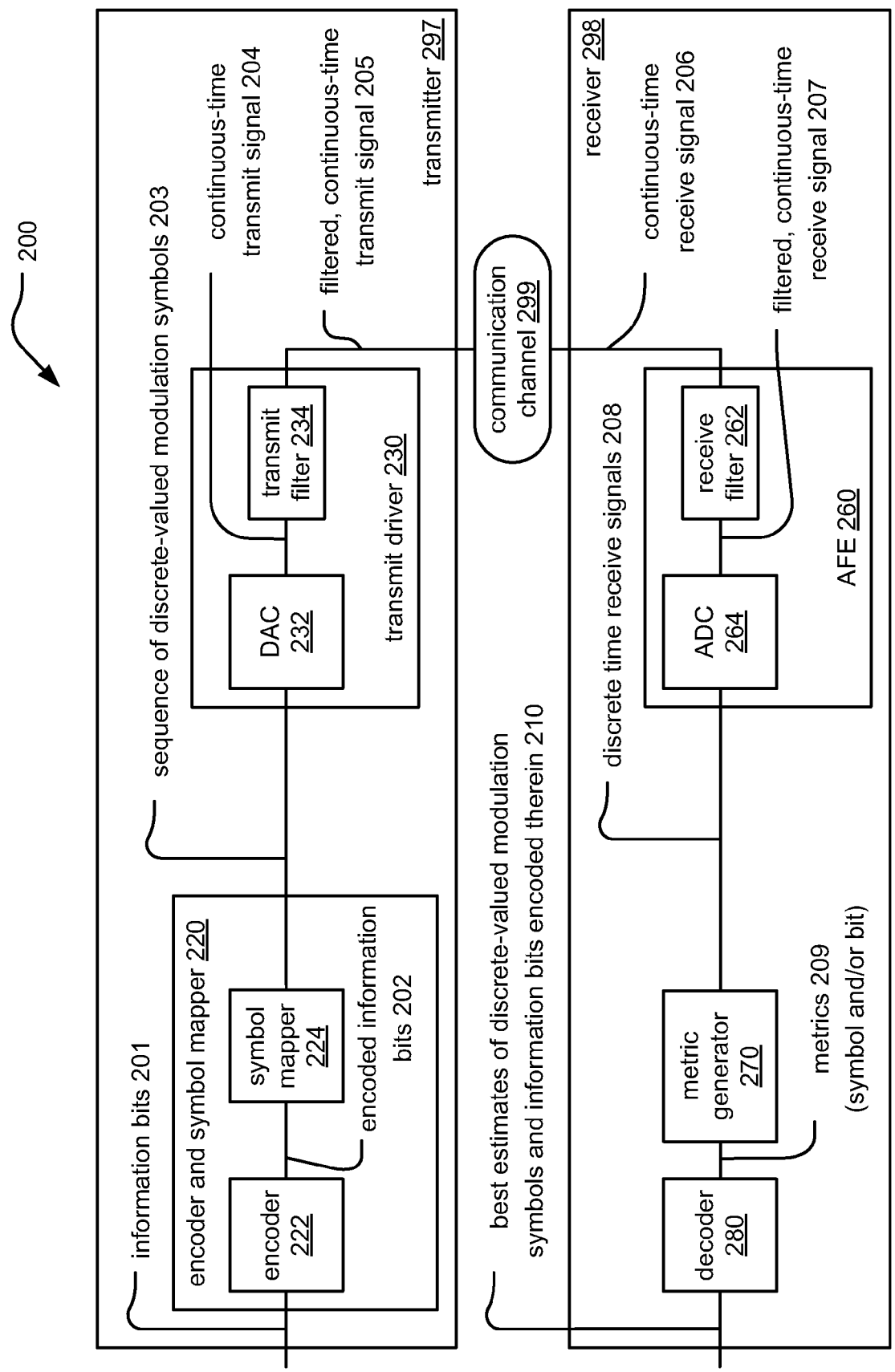

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Any of the various types of LDPC codes described herein can be employed within any such desired communication system (e.g., including those variations described with respect to FIG. 1), any information storage device (e.g., hard disk drives (HDDs), network information storage devices and/or servers, etc.) or any application in which information encoding and/or decoding is desired.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates metrics 209 (e.g., on either a symbol and/or bit basis) that are employed by a decoder 280 to make best estimates of the discrete-valued modulation symbols and information bits encoded therein 210.

The decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. Before more details are provided below, a general description of LDPC codes is provided.

Figure 3:
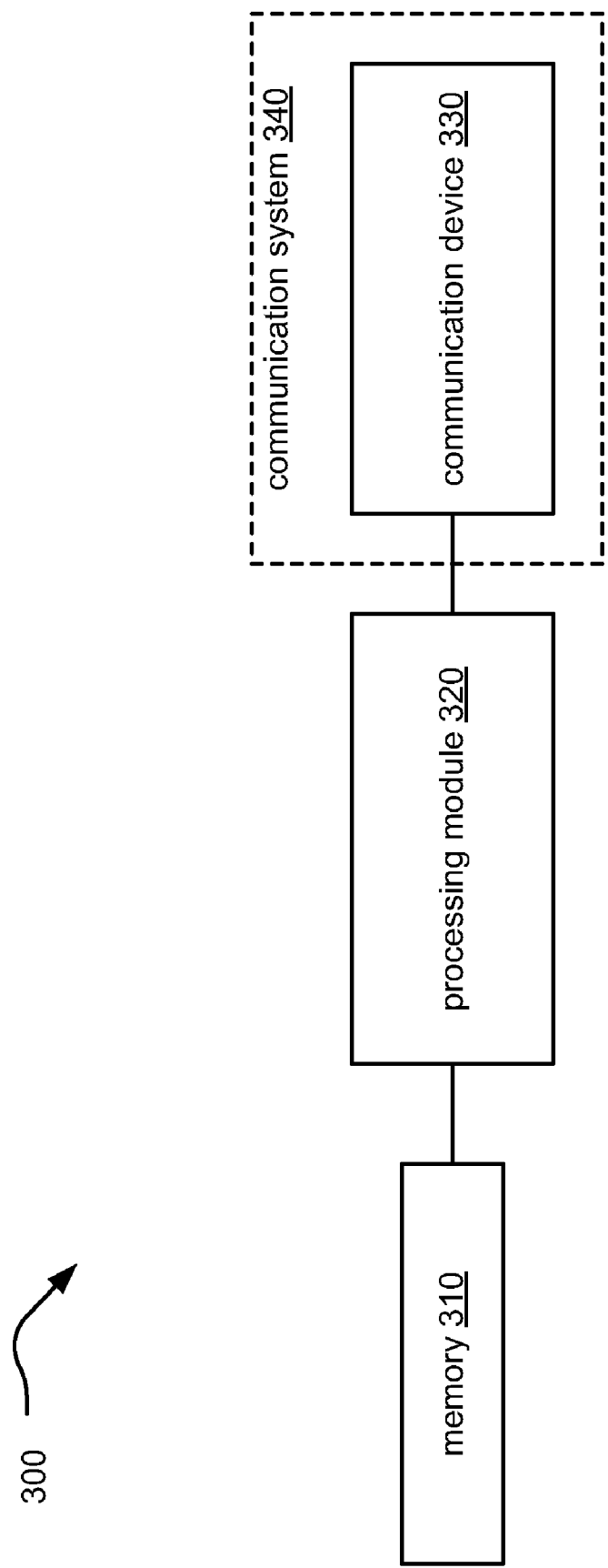
FIG. 3 illustrates an embodiment of an apparatus that is operable to perform LDPC decoding processing and/or LDPC code construction.

FIG. 3 illustrates an embodiment of an apparatus 300 that is operable to perform LDPC decoding processing and/or LDPC code construction. The apparatus 300 includes a processing module 320, and a memory 310. The memory 310 is coupled to the processing module, and the memory 310 is operable to store operational instructions that enable the processing module 320 to perform a variety of functions. The processing module 320 is operable to perform and/or direct the manner in which various LDPC codes may be constructed in accordance with any embodiment described herein, or any equivalent thereof.

The processing module 320 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 310 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 320 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the manner in which LDPC code construction is to be performed (e.g., the size of sub-matrices within the LDPC matrix of a corresponding LDPC code, the number of all-zero-valued sub-matrices, the cyclic shift (if any) of any sub-matrix within an LDPC matrix, etc.) can be provided from the apparatus 300 to a communication system 340 that is operable to employ and perform LDPC coding using a desired LDPC code. For example, information corresponding to the LDPC code being used (e.g., the parity check matrix of the LDPC code) can also be provided from the processing module 320 to any of a variety of communication devices 330 implemented within any desired such communication system 340 as well.

If desired, the apparatus 320 can be designed to generate multiple means of constructing LDPC codes in accordance with multiple needs and/or desires as well. In some embodiments, the processing module 320 can selectively provide different information (e.g., corresponding to different LDPC codes and their corresponding LDPC matrices, relative performance comparison between the various LDPC codes, etc.) to different communication devices and/or communication systems. That way, different communication links between different communication devices can employ different LDPC codes and/or means by which to perform LDPC encoding and/or decoding. Clearly, the processing module 320 can also provide the same information to each of different communication devices and/or communication systems as well without departing from the scope and spirit of the invention.

Figure 4:
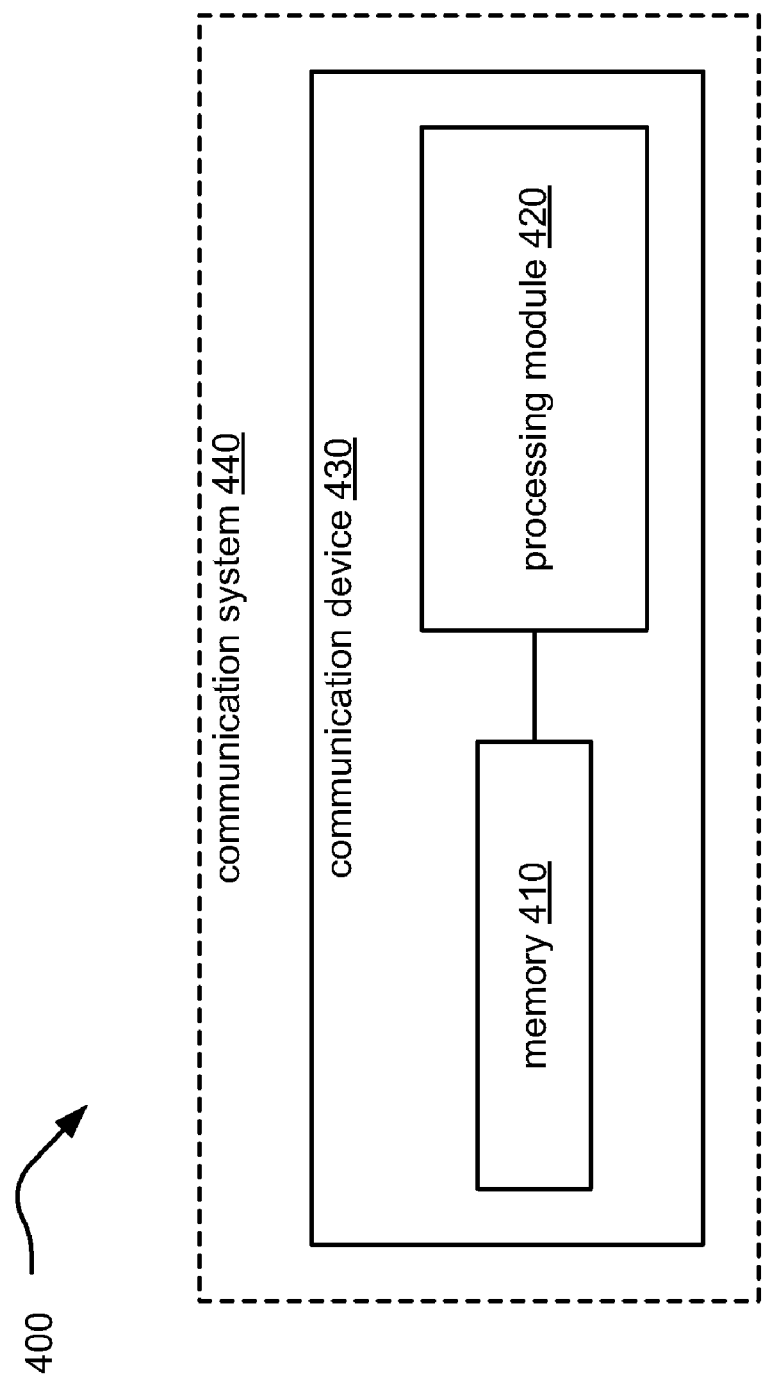
FIG. 4 illustrates an alternative embodiment of an apparatus that is operable to perform LDPC decoding processing and/or LDPC code construction.

FIG. 4 illustrates an alternative embodiment of an apparatus that is operable to perform LDPC decoding processing and/or LDPC code construction. The apparatus 400 includes a processing module 420, and a memory 410. The memory 410 is coupled to the processing module, and the memory 410 is operable to store operational instructions that enable the processing module 420 to perform a variety of functions. The processing module 420 (serviced by the memory 420) can be implemented as an apparatus capable to perform any of the functionality of any of the various modules and/or functional blocks described herein. For example, the processing module 420 (serviced by the memory 420) can be implemented as an apparatus capable to perform and/or direct the manner in which LDPC code construction is to be performed in accordance with any embodiment described herein, or any equivalent thereof.

The processing module 420 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 410 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 420 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 400 can be any of a variety of communication devices 430, or any part or portion of any such communication device 430. Any such communication device that includes the processing module 420 and/or memory 410 can be implemented within any of a variety of communication systems 440 as well. It is also noted that various embodiments of LDPC decoding processing in accordance with LDPC decoding processing as presented herein, and equivalents thereof, may be applied to many types of communication systems and/or communication devices.

Figure 5:
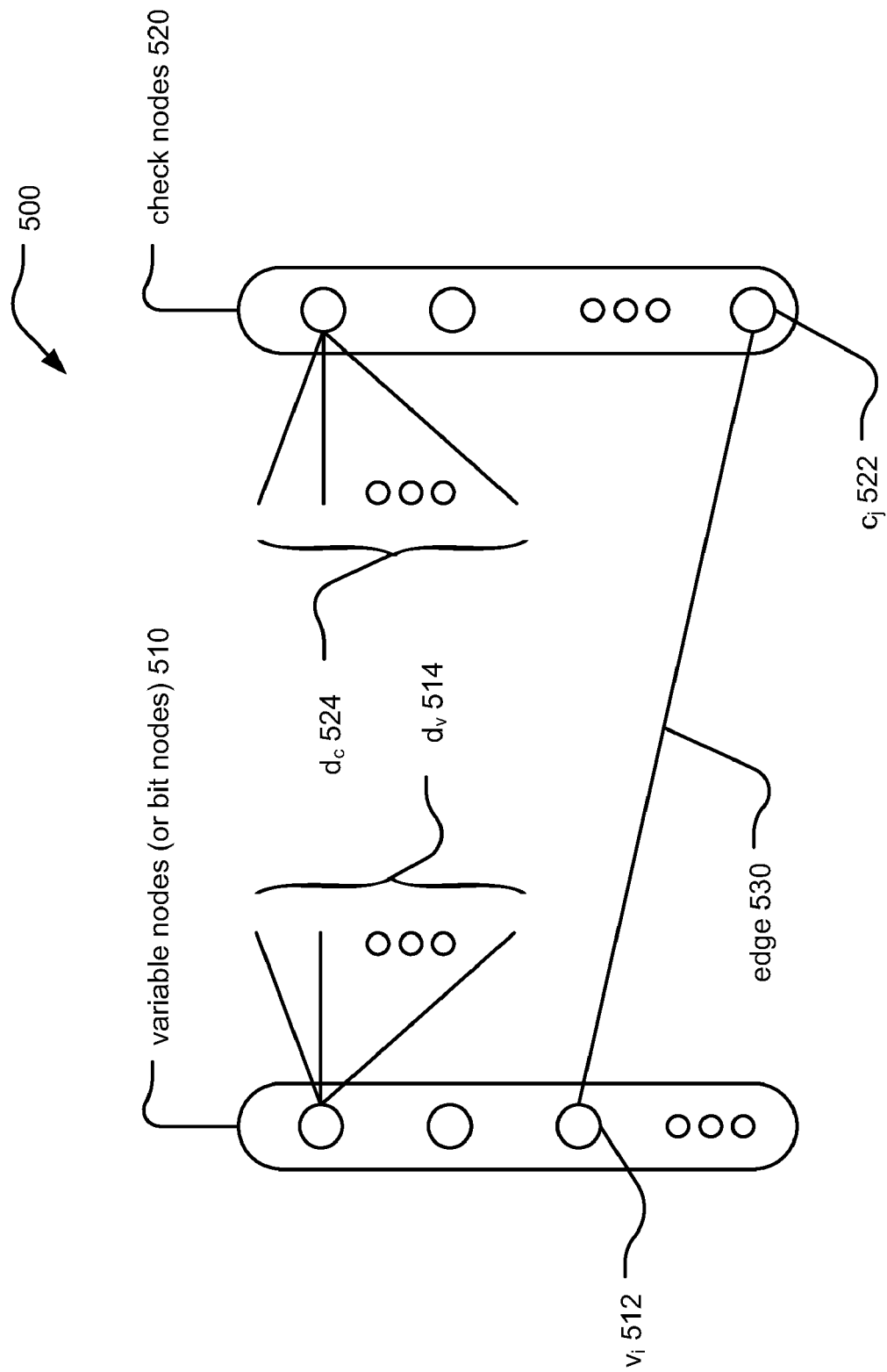
FIG. 5 illustrates an embodiment of an LDPC (Low Density Parity Check) code bipartite graph.

FIG. 5 illustrates an embodiment of an LDPC (Low Density Parity Check) code bipartite graph 500. In the art, an LDPC bipartite graph may also sometimes be referred to as a "Tanner" graph. An LDPC code may be viewed as being a code having a binary parity check matrix such that nearly all of the elements of the matrix have values of zeroes (e.g., the binary parity check matrix is sparse). For example, $H=(h_{i,j})_{M \times N}$ may be viewed as being a parity check matrix of an LDPC code with block length N.

LDPC codes are linear block codes and hence the set of all codewords $x \in C$ spans the null space of a parity check matrix, H.

$$Hx^T = 0, \forall x \in C \quad (1)$$

For LDPC codes, H, is a sparse binary matrix of dimension m×n. Each row of H corresponds to a parity check and a set element $h_{i,j}$ indicates that data symbol j participates in parity check i. Each column of H corresponds to a codeword symbol.

For each codeword x there are n symbols of which m are parity symbols. Hence the code rate r is given by:

$$r = (n-m)/n \quad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v,d_c)$ regular LDPC code, otherwise the LDPC code is called an irregular LDPC code.

LDPC codes were introduced by R. Gallager in [1] referenced below (also in [2] referenced below) and by M. Luby et al. in [3] also referenced below.

[1] R. Gallager, *Low-Density Parity-Check Codes*, Cambridge, Mass.: MIT Press, 1963.
[2] R. G. Gallager, "Low density parity check codes," *IRE Trans. Info. Theory*, vol. IT-8, January 1962, pp. 21-28.
[3] M. G. Luby, M. Mitzenmacher, M. A. Shokrollahi, D. A. Spielman, and V. Stemann, "Practical Loss-Resilient Codes", *Proc. 29th Symp. on Theory of Computing*, 1997, pp. 150-159.

A regular LDPC code can be represented as a bipartite graph 500 by its parity check matrix with left side nodes representing variable of the code bits (or alternatively as the "variable nodes" (or "bit nodes") 510 in a bit decoding approach to decoding LDPC coded signals), and the right side nodes representing check equations (or alternatively as the "check nodes" 520). The bipartite graph 500 (or sometimes referred to as a Tanner graph 500) of the LDPC code defined by H may be defined by N variable nodes (e.g., N bit nodes) and M check nodes. Every variable node of the N variable nodes 510 has exactly $d_v(i)$ edges (an example edge shown using reference numeral 530) connecting the bit node, $v_i$ 512, to one or more of the check nodes (within the M check nodes). The edge 530 is specifically shown as connecting from the bit node, $v_i$ 512, to the check node, $c_j$ 522. This number of $d_v$ edges (shown as $d_v$ 514) may be referred to as the degree of a variable node i. Analogously, every check node of the M check nodes 520 has exactly $d_c$ (j) edges (shown as $d_c$ 524) connecting this node to one or more of the variable nodes (or bit nodes) 510. This number of edges, $d_c$, may be referred to as the degree of the check node j.

An edge 530 between a variable node $v_i$ (or bit node $b_i$) 512 and check node $c_j$ 522 may be defined by $e=(i, j)$. However, on the other hand, given an edge $e=(i, j)$, the nodes of the edge may alternatively be denoted as by $e=(v(e),c(e))$ (or $e=(b(e), c(e))$). Alternatively, the edges in the graph correspond to the set elements of H where a set element $h_{j,i}$ indicates that an edge connects a bit (e.g., variable) node i with parity check node j.

Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$); these edges are referred to as bit edges, and the messages corresponding to these bit edges are referred to as bit edge messages.

Given a check node $c_j$, one may define the set of edges emitting from the node $c_j$ by $E_c(j)=\{e|c(e)=j\}$; these edges are referred to as check edges, and the messages corresponding to these check edges are referred to as check edge messages. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as a graph code. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [3] referenced above.

In general, with a graph of an LDPC code, the parameters of an LDPC code can be defined by a degree of distribution, as described within M. Luby et al. in [3] referenced above and also within the following reference [4]:

[4] T. J. Richardson and R. L. Urbanke, "The capacity of low-density parity-check code under message-passing decoding,"*IEEE Trans. Inform. Theory*, Vol. 47, No. 2, February 2001, pp. 599-618.

This distribution may be described as follows:
Let $\lambda_i$ represent the fraction of edges emanating from variable nodes of degree i and let $\rho_i$ represent the fraction of edges emanating from check nodes of degree i. Then, a degree distribution pair $(\lambda,\rho)$ is defined as follows:

$$\lambda(x) = \sum_{i=2}^{M_v} \lambda_i x^{i-1}$$

and $$\rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects and/or embodiments of the invention are also operable to accommodate both regular LDPC codes and irregular LDPC codes.

It is also noted that many of the embodiments described herein employ the terminology of "bit node" and "bit edge message", or equivalents thereof. Oftentimes, in the art of LDPC decoding, the "bit node" and "bit edge message" are alternatively referred to as "variable node" and "variable edge message", in that, the bit values (or variable values) are those which are attempted to be estimated. Either terminology can be employed in accordance with certain aspects of the invention.

Herein, a methodology is presented by which a large number of LDPC codes can be constructed in a very efficient manner for comparison and selection of one or more of those LDPC codes to be used in any of a wide variety of communication systems types and communication device types. Any other application context (e.g., including information storage device, etc.) in which ECC may be employed can also use one or more of these LDPC codes.

In addition, the manner presented herein in which LDPC codes may be constructed allows for a designer to compare and employ various sub-matrix sizes of the corresponding LDPC matrices.

Figure 6:
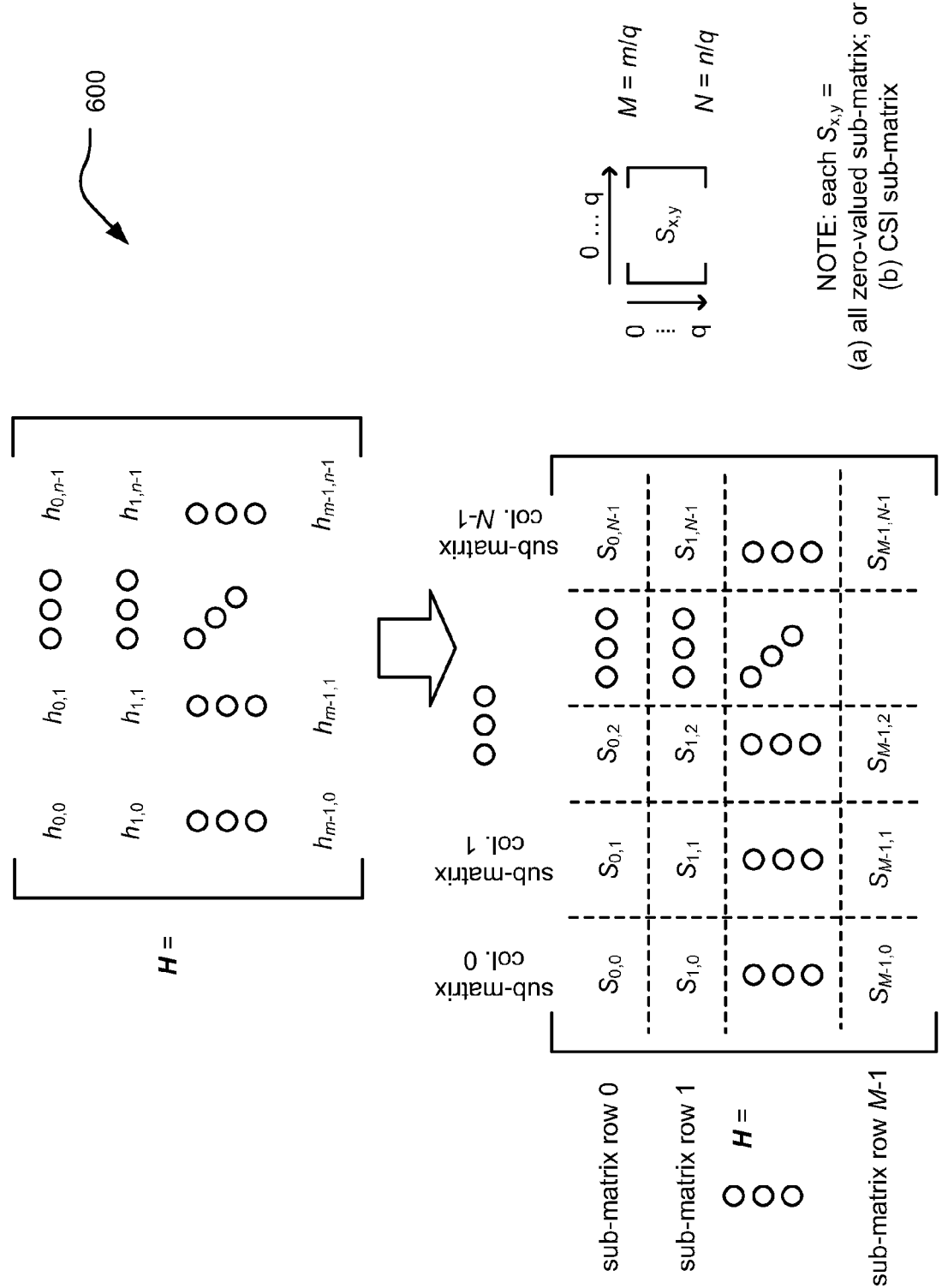
FIG. 6 illustrates an embodiment of the relationship between an overall LDPC matrix and the individual sub-matrices therein that include all zero-valued sub-matrices and/or CSI (Cyclic Shifted Identity) sub-matrices (including the sub-matrix rows and sub-matrix columns of the LDPC matrix).

FIG. 6 illustrates an embodiment 600 of the relationship between an overall LDPC matrix and the individual sub-matrices therein that include all zero-valued sub-matrices and/or CSI (Cyclic Shifted Identity) sub-matrices (including the sub-matrix rows and sub-matrix columns of the LDPC matrix).

A binary LDPC code may be fully described by its parity check matrix (i.e., its LDPC matrix). At the top of FIG. 6, the individual elements of an LDPC matrix, H, are shown:

$$H = \begin{bmatrix} h_{0,0} & h_{0,1} & \cdots & h_{0,n-1} \\ h_{1,0} & h_{1,1} & \cdots & h_{1,n-1} \\ \vdots & \vdots & \ddots & \vdots \\ h_{m-1,0} & h_{m-1,1} & \cdots & h_{m-1,n-1} \end{bmatrix}$$

where n is the number of bits in a codeword, m is the number of parity check equations of the LDPC code, and $h_{i,j}$ is either 0 or 1. An n-bit vector c is a codeword (i.e., of the LDPC code) if and only if $$Hc=0.$$

For such an LDPC code, the parity matrix H is also composed of a number of q-by-q (i.e., q×q) square sub-matrices as shown in the bottom portion of FIG. 6 and also below:

$$H = \begin{bmatrix} S_{0,0} & S_{0,1} & \cdots & S_{0,N-1} \\ S_{1,0} & S_{1,1} & \cdots & S_{1,N-1} \\ \vdots & \vdots & \ddots & \vdots \\ S_{M-1,0} & S_{M-1,1} & \cdots & S_{M-1,N-1} \end{bmatrix}$$

where M=m/q, N=n/q, and each sub-matrix, $S_{I,J}$, thereof is a q-by-q sub-matrix that is either an all zero-valued sub-matrix (i.e., in which all elements thereof are the value or zero "0") or a CSI (Cyclic Shifted Identity) sub-matrix. A CSI sub-matrix S is characterized by a shift-value, $\lambda(S)$, such that the components of S are defined as follows:

$$s_{i,j} = \begin{cases} 1 & \text{if } i + \lambda(S) = j (\bmod q) \\ 0 & \text{otherwise} \end{cases}$$

for any i and j, with $0 \leq i < q$ and $0 \leq j < q$. For example, the q-by-q identity matrix is itself a CSI matrix with a shift-value $\lambda(S)=0$ (i.e., a CSI sub-matrix that has undergone a cyclic shift of zero "0").

As can be seen, the LDPC matrix (as depicted in the lower portion of the diagram), includes various sub-matrix rows and sub-matrix columns. These sub-matrix rows and sub-matrix columns may be viewed as being based on the sub-matrix construction of the LDPC matrix (e.g., shown as sub-matrix rows 0 through M–1 and sub-matrix columns 0 through N–1).

FIG. 7 illustrates an embodiment 700 of sub-matrix based decoding of an LDPC coded signal using APP (a posteriori probability) (or gamma ($\gamma$)) and check edge message ($\lambda$) updating.

A novel LDPC decoder architecture is presented herein that provides for accelerated decoding performance when compared with designs that implement standard belief propagation (BP) decoding approach (i.e., it provides for a greater coding gain with the same number of decoder iterations or equivalent coding gain with fewer decoder iterations that prior art approaches). In addition, this novel decoding architecture can be effectively pipelined while incurring a minimal coding gain loss to increase a decoder's throughput increase and also to reduce the decoder area (i.e., size, real estate, footprint when implemented in hardware).

The novel LDPC decoder architecture described herein is applicable to LDPC codes operating on a parity check matrix, H, consisting of CSI (Cyclic Shifted Identity) sub-matrices (or matrix sub-blocks) or permuted identity sub-matrices (or matrix sub-blocks). In such a structure, the entire LDPC matrix is broken into square sub-matrices such that each sub-matrix consists of either a CSI sub-matrix or a permuted identity sub-matrix, or a null matrix (i.e., an all zero-valued sub-matrices in which all elements therein have a value of 0). LDPC matrices having such a structure can be found in a variety of applications including those that comply with the IEEE 802.11n and IEEE 802.16e standards, among other application areas.

Traditional decoding of LDPC code signals is based on the belief propagation (BP) decoding approach [as described by R. Gallager in [1] referenced above (also in [2] referenced above). For the BP decoding approach, each iteration has distinct check and variable (or bit) update phases. All the check nodes are updated before all variable nodes are updated and vice-versa. This can yield reliable decoding performance down to extremely low packet error rates (e.g. $10^{-12}$).

There is at least another manner in which LDPC decoding may be performed besides the standard belief propagation (BP) decoding approach. Another approach involves APP (a posteriori probability) (or gamma ($\gamma$)) and check edge message ($\lambda$) updating as opposed to bit edge message and check edge message updating.

In this LDPC decoding that employs APP (or gamma ($\gamma$)) updating, the variable and check update operations may be combined to provide for even faster decoding. One approach that capitalizes on the use of APP (or gamma ($\gamma$)) updating is referred to as layered decoding as described by Hocevar in reference [5].

[5] Hocevar, D. E., "A reduced complexity decoder architecture via layered decoding of LDPC codes," *IEEE Workshop on Signal Processing Systems*, 2004, pp. 107-112.

In this layered decoding approach, performance at extremely low packet error rates is sacrificed to achieve faster convergence (e.g., fewer decoding iterations). In addition, a relatively higher coding performance is achieved at higher packet error rates in the range 0.01% to 10%. Layered decoding operates by performance all the check updates for a given sub-matrix (or sub-block) row in parallel followed by a partial (or simplified) variable node update. The posterior information about each decoded bit from each sub-matrix (or sub-block) row update is passed to the next sub-matrix (or sub-block) row update yielding faster decoder convergence.

Stated another way, layered LDPC decoding operates by separately decoding each sub-matrix row of an LDPC matrix and then passing the APP (or gamma ($\gamma$)) values from the entire sub-matrix row to the next sub-matrix row. This can be viewed as propagating the APP (or gamma ($\gamma$)) values forward/down through the sub-matrix rows of the LDPC matrix. In accordance with layered LDPC decoding approach, a particular sub-matrix row must be completely finished (e.g., decoded) before its corresponding APP (or gamma (γ)) values can be employed and considered for use in a subsequent sub-matrix row.

By employing this decoding approach (vs. the BP decoding approach), a simple APP (or gamma (γ)) update is performed instead of the variable node update (as employed in BP decoding approach). It is noted, however, that the APP (or gamma (γ)) values and the intrinsic information values (λ) (e.g., which are analogous to the check edge messages in the BP decoding approach) are stored (e.g., in memory, registers, and/or daisy chains, etc.).

This layered decoding approach that employs APP (or gamma (γ)) update can converge faster than the BP decoding approach, and as such, it can effectuate a higher coding code for a comparable number of decoding iterations when compared to the BP decoding approach. However, as is described herein, there is no manner by which the layered decoding approach can be pipelined unless a significant reduction in coding gain is acceptable. In other words, to achieve a relatively high throughput of the data path flow within a layered decoder necessarily requires the inclusion of additional hardware (e.g., logic gates, etc.), and this necessary footprint of the hardware is much larger than would otherwise be the case because more computation must be done in parallel. The necessary use of such additional hardware for routing, alignment, etc. (e.g., logic gates, etc.) cannot be of minimal size.

Figure 8:
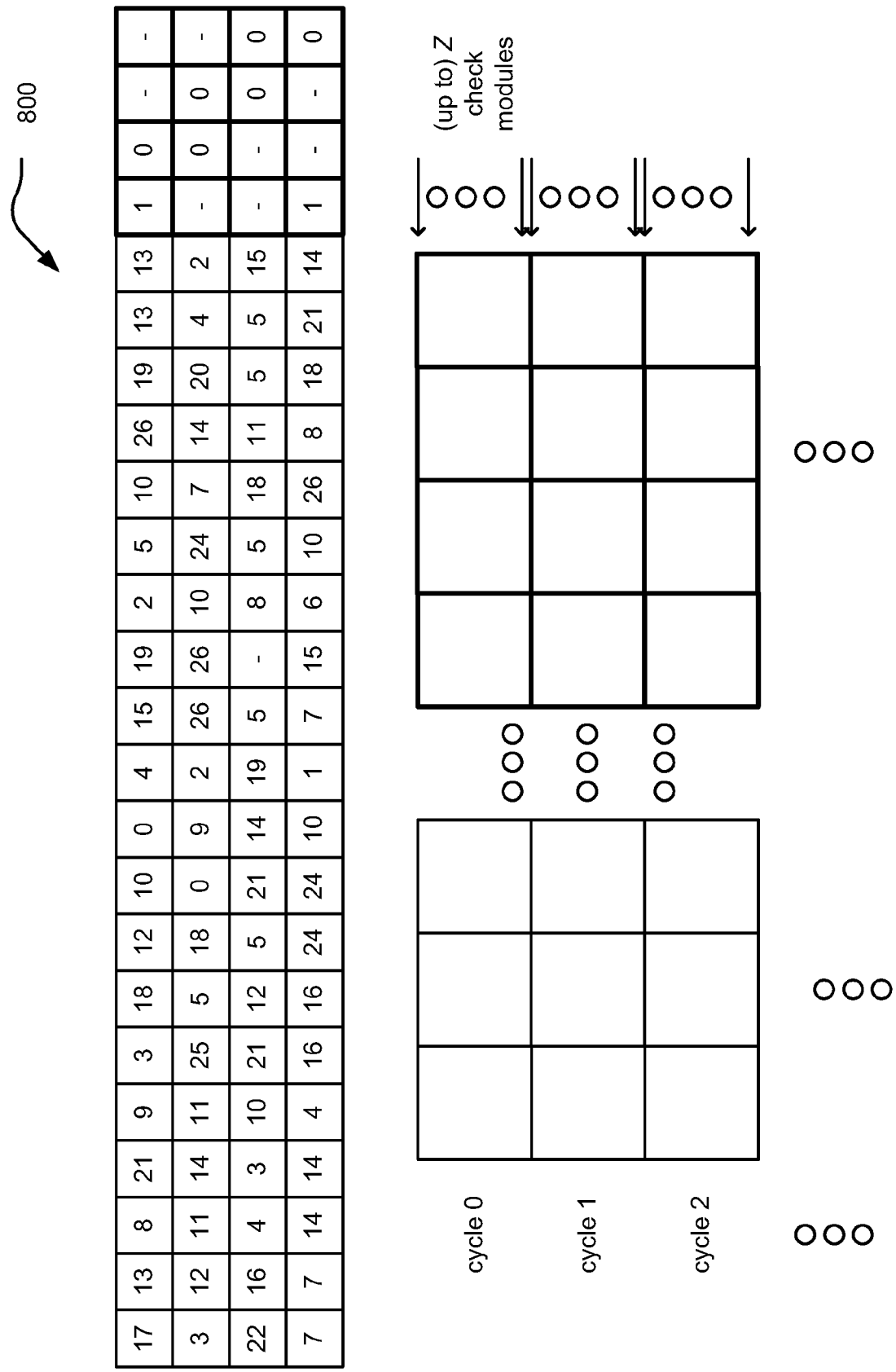
FIG. 8 illustrates an embodiment of layered decoding of an LDPC coded signal.

FIG. 8 illustrates an embodiment 800 of layered decoding of an LDPC coded signal. As can be seen, a number of check modules (e.g., up to Z) are employed so that all rows of a sub-matrix row of the LDPC matrix are processed simultaneously (all rows of the top sub-matrix row during cycle 0, all rows of the $2^{nd}$ to top sub-matrix row during cycle 2, all rows of the $3^{rd}$ to top sub-matrix row during cycle 2, etc.).

In this embodiment as well as others, each sub-matrix of the depicted LDPC matrix is a CSI (Cyclic Shifted Identity) sub-matrix that is characterized by a shift-value, λ(S). For example, the top left hand sub-matrix has a value of 17, and is therefore a CSI sub-matrix with a shift-value of 17, λ(17). All of the sub-matrices depicted as a "-" are all zero-valued sub-matrices (i.e., all elements of such a sub-matrix are a value of 0, and this may also be referred to as a null sub-matrix). When a sub-matrix has a value of 0, that CSI sub-matrix has a shift-value of 0, λ(0), and may be viewed as being an identity sub-matrix.

Figure 9:
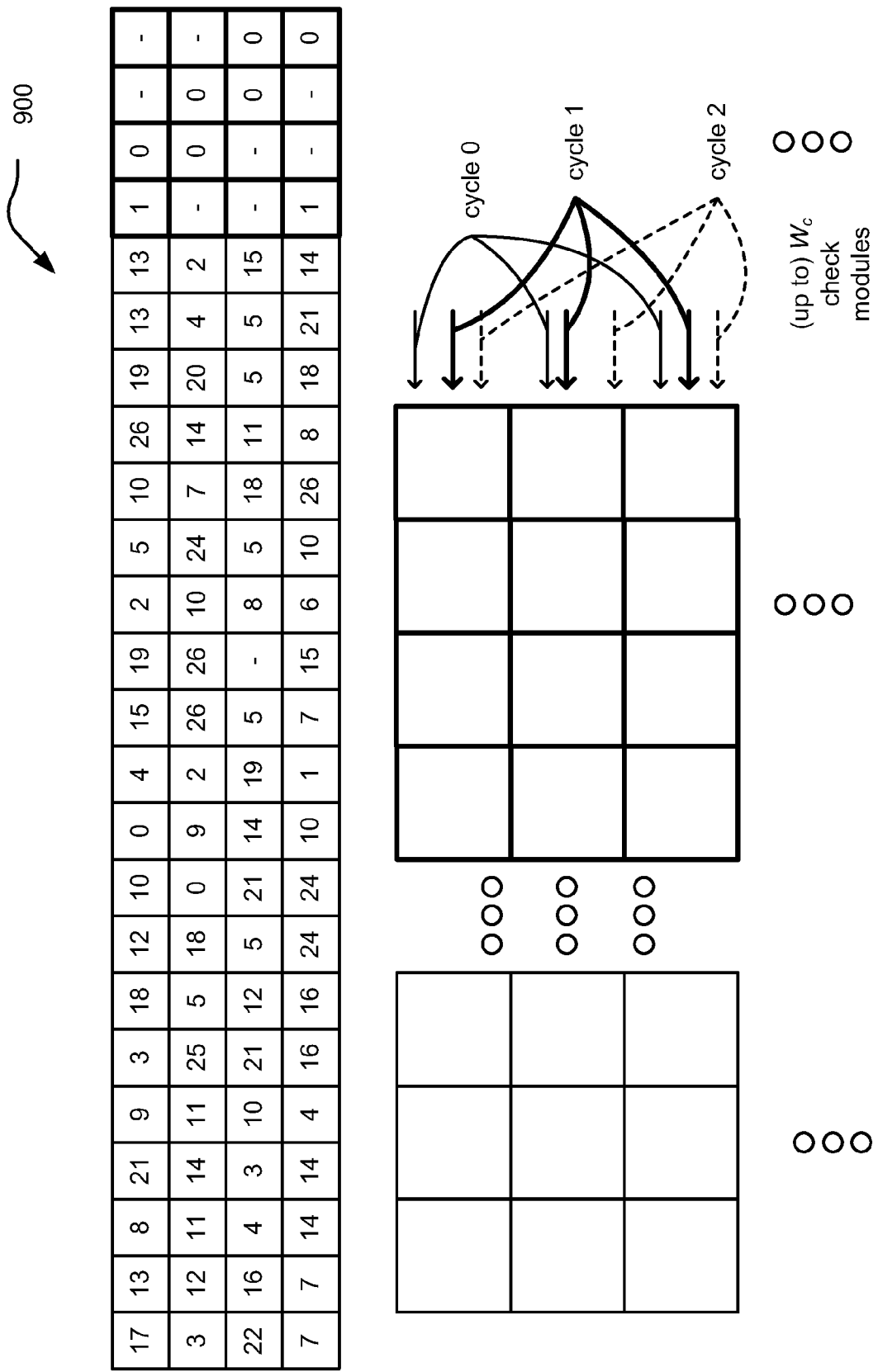
FIG. 9 illustrates an embodiment of accumulating decoding of an LDPC coded signal.

FIG. 9 illustrates an embodiment 900 of accumulating decoding of an LDPC coded signal. In accordance with accumulating LDPC decoding, the computation of the check updates (λ) is performed in a different order than that as performed in accordance with the layered decoding (e.g., as in FIG. 8). Rather than processing an entire sub-matrix (or sub-block) row of check updates simultaneously as in layered decoding (e.g., as in FIG. 8), one or more individual rows within a number of sub-matrix rows (or all sub-matrix or sub-block rows) are processed in parallel. The amount of parallelism is specified by the designer and is typically an integer divisor of the sub-matrix (or sub-block) size. In this embodiment, a number of check modules (e.g., $W_c$) is shown as being implemented to operate on a number of individual rows spanning across multiple sub-matrix rows (or all sub-matrix or sub-block rows) in parallel.

However, in order to avoid coding performance loss, it is important that only one element in each column of the matrix by processed at any given time. In order to satisfy this constraint a suitable schedule must be found prior to implementing the particular embodiment. The use of an appropriate schedule allows for the simultaneous update of an LLR value (i.e., APP (or gamma(γ)) by multiple checks (λs).

During both the layered and accumulating decoding approaches, a signed value (e.g., plus (+) or minus (-)) may be maintained for each column of the matrix corresponding to the best estimate of the log-likelihood ratio (LLR) of each codeword bit (i.e., APP (or gamma(γ)).

In the layered decoding approach, each check update computes a new LLR value (i.e., APP (or gamma(γ))) based on its value prior to the current update. If the check updates (λs) are pipelined, a coding gain loss may be incurred if the same LLR value must be updated on consecutive clock cycles. In accordance with layered decoding, this is because the contribution of one or more of the check updates will be lost and not incorporated into the results of subsequent check updates. This is described in more detail with respect to FIG. 11D.

However, in contrast, when performing accumulating decoding as described herein, each check update computes and adds the incremental change to the LLR value (i.e., Δγ) based on its value prior to the current update (i.e., γ'=γ+Δγ). If the check updates (λs) are pipelined, then the contribution from the check updates in consecutive cycles can still be incorporated into the final LLR value (i.e., no updates are lost). This will result in almost no coding gain loss when the accumulating decoder is pipelined.

It is also noted that the check edge message update as employed in accordance with the accumulating decoding approach can employ any of a wide variety of processing means. For example, the accumulating LDPC decoder architecture can be used with almost any check node update type, including sum-product, min* (min-star), min** (min-double-star), min-sum [as described by Anastasopoulos in reference [6]], modified min-sum [as described by Karkooti in reference [7]], and BCJR [as described by Mansour in reference [8], and/or any other desired means of performing check edge message updating. The appropriate computation type can be chosen based on the area, latency, and coding gain requirements of the application.

[6] Anastasopoulos, A., "A comparison between the sum-product and the min-sum iterative detection algorithms based on density evolution," *IEEE Global Telecommunications Conference*, Vol. 2, No. 25-29, November 2001, pp. 1021-1025.

[7] Karkooti, M., and Cavallaro, J. R., "Semi-parallel reconfigurable architectures for real-time LDPC decoding,"*Proceedings of the International Conference on Information Technology: Coding and Computing*, Vol. 1, 2004, pp. 579-585.

[8] Mansour, M. M., and Shanbhag, N. R., "Low-power VLSI decoder architectures for LDPC codes," *Proceedings of the 2002 International Symposium on Low Power Electronics and Design*, 2002, pp. 284-289.

Figure 10:
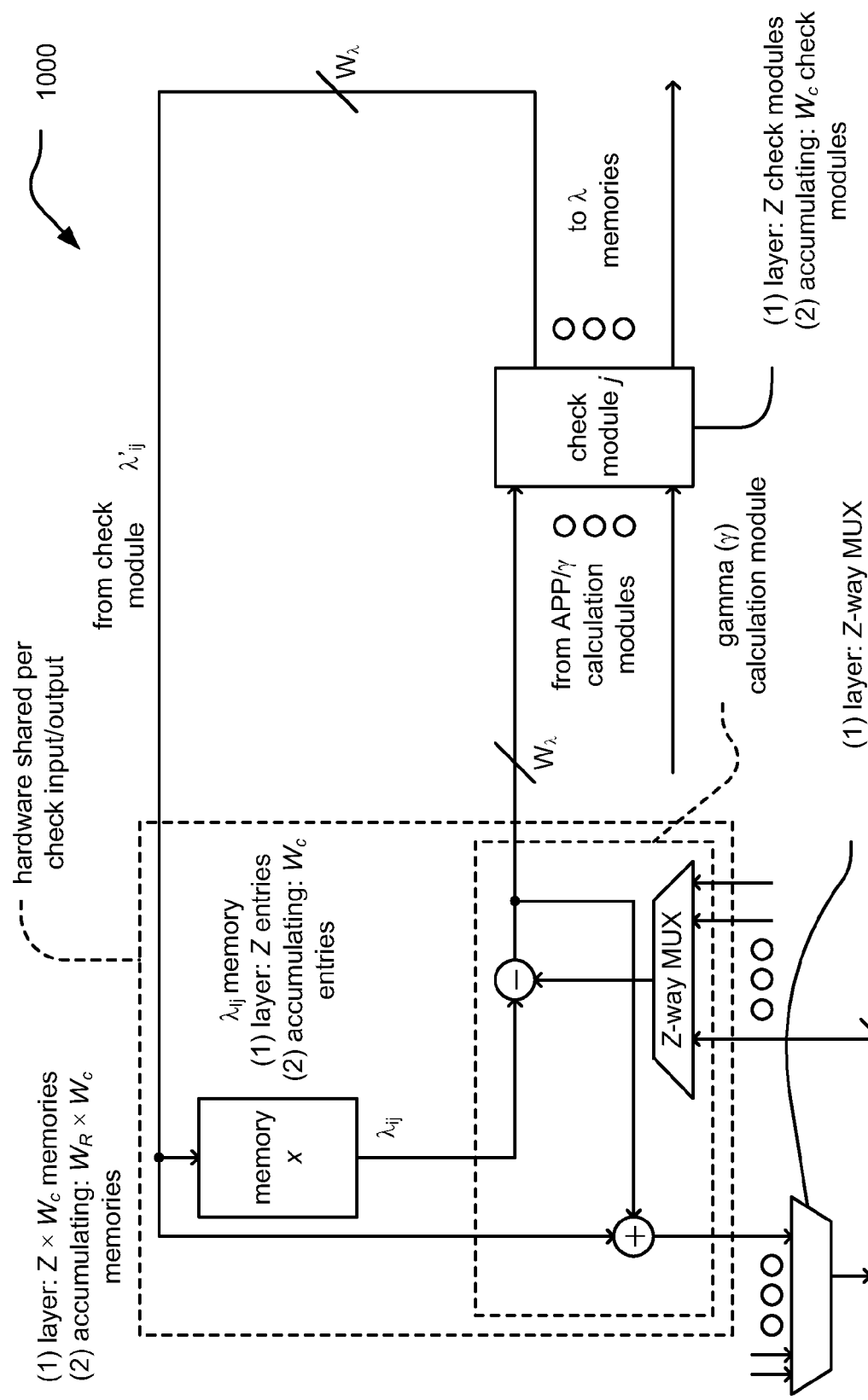
FIG. 10 illustrates an embodiment comparing the data path flow as employed within layered decoding and accumulating decoding.

FIG. 10 illustrates an embodiment 1000 comparing the data path flow as employed within layered decoding and accumulating decoding. In this embodiment, address generators are employed, additional multiplexers for memory sharing, the received input LLR value (which is used to initialize the APP or gamma(γ) values), as well as the decoded bit logic are not shown. This embodiment shows the data path flow with respect to the check edge messages (λs). As can be seen, a check module j operates on the input values from the various gamma (γ) calculation modules (alternatively, referred to as APP (a posteriori probability) modules) (e.g., only one gamma (γ) calculation module is shown, but it is noted that additional gamma (γ) calculation modules are employed as needed to perform appropriately gamma (γ) update/calculation, as can be seen by the parallel indicated nature of the gamma/APP modules and signal lines such as $W_\lambda$ and $W_\gamma$, etc.).

In the layered decoding approach, Z check modules are employed, whereas in the accumulating decoding approach, only $W_c$ check modules are employed. This can be compared with the embodiments of FIG. 8 and FIG. 9 while also considering the distinctions between the layered decoding and accumulating decoding approaches.

Once the check module j updates the check edge messages ($\lambda$s), these values are passed to the check edge message ($\lambda$) memories. The check edge messages ($\lambda'_{ij}$) are shown as being passed to a memory x, the check edge messages ($\lambda'_{ij}$) memory will include Z entries within the layered decoding approach, and it will include $W_c$ entries within the accumulating decoding approach. The hardware employed for the memories as well as the gamma ($\gamma$) update/calculation is shared per check edge message input/output. In this embodiment, only one memory x is shown, but it is noted that additional memories are employed as needed to perform appropriately gamma ($\gamma$) update/calculation, as can be seen by the parallel indicated nature of the gamma/APP modules and signal lines such as $W_\lambda$. In the layered decoding approach, $Z \times W_R$ memories are employed, whereas in the accumulating decoding approach, only $W_R \times W_c$ memories are employed.

The check edge message ($\lambda_{ij}$) output from the memory x is subtracted from an APP (or gamma($\gamma_i$)) value output from a Z-way multiplexer (MUX). The result there from is passed to the check module j for subsequent processing as well as passed to an adder, that also receives the check edge messages ($\lambda'_{ij}$) output from the check module j, whose result is passed to a MUX that is a Z-way MUX (in layered decoding) and an $W_c$-way MUX (in accumulating decoding). The output of this MUX (regardless of its implementation) is provided to a number of registers to store APP (or gamma($\gamma_i$)). For example, one embodiment employs 1944 registers to store APP (or gamma($\gamma_i$)).

It is again noted here, as within any embodiment that performs check edge message ($\lambda$) update (e.g., as in the check module j of this embodiment) that the manner in which check edge message updating is performed may be varied and as desired in a particular embodiment without departing from the scope and spirit of the invention (e.g., sum-product, min* (min-star), min** (min-double-star), min-sum [as described by Anastasopoulos in reference [6]], modified min-sum [as described by Karkooti in reference [7]], and BCJR [as described by Mansour in reference [8], and/or any other desired means of performing check edge message updating).

It is also noted that, when performing layered decoding, several additional MUXs or barrel shifters (BSs) may be needed to ensure proper alignment of the APP (or gamma($\gamma$)) values when performing gamma ($\gamma$) update/calculation as well as performing check edge message updating (e.g., as in the check module j).

FIG. 11A illustrates an embodiment 1101 of layered decoding of an LDPC coded signal. As can be seen in this embodiment, a check module receives a value that is a difference of ($\gamma - \lambda$) (i.e., a difference between a check edge message ($\lambda$) and an APP (or gamma($\gamma$)) value. The check module then processes this value ($\gamma - \lambda$) to generate an updated check edge message ($\lambda'$) in accordance with the function of $\lambda' = chk(\gamma - \lambda)$. This updated check edge message ($\lambda'$) is then output and provided to an adder that also receives the value ($\gamma - \lambda$) thereby generating and outputting the updated APP (or gamma($\gamma'$)) value which is then provided to a register. The output of the register is then provided to the subtraction module that generates the difference of ($\gamma - \lambda$) for use in subsequent decoding.

FIG. 11B illustrates an embodiment 1102 of pipelined layered decoding of an LDPC coded signal. This embodiment is similar to the embodiment of FIG. 11A with the addition of some registers (shown in bold) that allow for the beginning of processing of a subsequent sub-matrix row before the completion of a current or previous sub-matrix row. While this can effectuate faster processing from certain perspectives, as will be seen within subsequent embodiments of layered decoding, this can sometimes result in performance loss, in that, certain contributions of an APP (or gamma($\gamma$)) value are simply lost.

FIG. 11C illustrates an embodiment 1103 of layered decoding of an LDPC coded signal in which consecutive APP (a posteriori probability) (or gamma ($\gamma$)) update occurs properly. As a function of time (from left to right), the APP (or gamma($\gamma_i$)) value are fed into and passed out of registers and to appropriate check modules (e.g., shown as check a and check b in this embodiment) for check edge message updating. It is also noted that a check a' module (e.g., not specifically shown in the diagram but what would be implemented below the first shown register on the left hand side of FIG. 11D) could also be operating in parallel with the check a module to perform check edge message updating to calculate/update another change in an APP (or gamma($\gamma$)) value (i.e., $\Delta\gamma$).

Without performing pipeline layered decoding (i.e., only layered decoding as in FIG. 11A), it can be seen that the update of consecutive an APP (or gamma($\gamma$)) values are performed without problem. However, this is not the case in the pipelined layered decoding of FIG. 11A as is shown with reference to FIG. 11D.

FIG. 11D illustrates an embodiment 1104 of pipelined layered decoding of an LDPC coded signal in which contributions of various consecutive APP (a posteriori probability) (or gamma ($\gamma$)) updates are lost. In this embodiment as well, as a function of time (from left to right), the APP (or gamma ($\gamma_i$)) value are fed into and passed out of registers and to appropriate check modules (e.g., shown as check a and check b in this embodiment) for check edge message updating.

However, as can be seen within the pipeline layered decoding (i.e., as in FIG. 11B), it can be seen that when the update of consecutive an APP (or gamma($\gamma$)) values is performed, certain contributions thereof are simply lost. For example, the contribution of the APP (or gamma ($\gamma$)) value from check a will not be included when performing the check b calculation. In other words, the incremental contribution from the APP (or gamma ($\gamma$)) value from check a will not be included when performing the APP (or gamma ($\gamma$)) update/calculation in check b. This can result in an undesirable performance loss when decoding LDPC coded signals using pipeline layered decoding.

FIG. 12A illustrates an embodiment 1201 of accumulating decoding of an LDPC coded signal. The decoding process is different in accordance with accumulating decoding of an LDPC coded signal (than in accordance with layered decoding), and these difference ensure that the problems encountered with the updating of consecutive an APP (or gamma($\gamma$)) values are avoided. The APP (or gamma($\gamma$)) value update calculation, in accordance with accumulating decoding, is different, in that, the decoding processing is performed as a function of change in an APP (or gamma($\gamma$)) value, which may be viewed as calculating the value ($\Delta\gamma$).

For example, the update of an APP (or gamma($\gamma$)) value is performed as follows:

$\gamma' = \lambda' + (\gamma - \lambda)$, where $\lambda' = chk(\gamma - \lambda)$, and where $\gamma'$ is the updated/calculated value of the APP (or gamma($\gamma$)) value;

$\lambda'$ is the updated/calculated value of the check edge message;

$\gamma$ is the previous/prior value of the APP (or gamma($\gamma$)) value; and $\lambda$ is the previous/prior value of the check edge message.

Therefore, the change in an APP (or gamma($\gamma$)) value (i.e., $\Delta\gamma$) may then be calculated as follows:

$$\Delta\gamma=\gamma'-\gamma$$

$$\Delta\gamma=\gamma'-\gamma$$

$$\rightarrow \Delta\gamma=\lambda'+(\gamma-\lambda)-\gamma=\lambda'-\lambda.$$

Therefore, it can be seen that the change in an APP (or gamma($\gamma$)) value (i.e., $\Delta\gamma$) may then be calculated as follows:

$$\gamma'=\gamma+\Delta\gamma.$$

Also, the change in an APP (or gamma($\gamma$)) value (i.e., $\Delta\gamma$) may then be calculated as follows (which is a function of differences in current/updated and previous/prior check edge messages):

$$\Delta\gamma=\lambda'-\lambda.$$

This calculation of the individual contributions of the change in an APP (or gamma($\gamma$)) value (i.e., $\Delta\gamma$) allows for an effective pipelining in accordance with accumulating decoding.

As can be seen in this embodiment, a check module receives a value that is a difference of ($\gamma-\lambda$) (i.e., a difference between a check edge message ($\lambda$) and an APP (or gamma($\gamma$)) value. This embodiment may be viewed as being composed of an APP module or a gamma ($\gamma$) module (e.g., composed of the 2 subtractors, the adder, and the register compose the APP module or a gamma ($\gamma$) module) and a check module. The check module then processes this value ($\gamma-\lambda$) to generate an updated check edge message ($\lambda'$) in accordance with the function of $\lambda'=\text{chk}(\gamma-\lambda)$. This updated check edge message ($\lambda'$) is then output and provided to a subtraction module (that subtracts the check edge message ($\lambda$) value) thereby generating a change in an APP (or gamma($\gamma$)) value (i.e., $\Delta\gamma$) may then be calculated as follows:

$$\Delta\gamma=\lambda'-\lambda.$$

This change value ($\Delta\gamma$) is then provided to an additional module or adder that also receives the previous APP (or gamma($\gamma$)) value thereby generating the updated/calculated APP (or gamma($\gamma'$)) value as follows:

$$\gamma'=\gamma+\Delta\gamma.$$

The output of the register is then provided to the subtraction module or subtractor that generates the difference of ($\gamma-\lambda$) for use in subsequent decoding. At any time, the value currently in the register (e.g., current value of APP/gamma ($\gamma$)) may be retrieved and employed to assist in making an estimate of an information bit encoded within an LDPC (Low Density Parity Check) coded signal (such as by using a hard limiter).

FIG. 12B illustrates an embodiment 1202 of pipelined accumulating decoding of an LDPC coded signal.

This embodiment is similar to the embodiment of FIG. 12A with the addition of some registers (shown in bold) that allow for a pipelined implementation of accumulating decoding. As will also be seen within subsequent embodiments of pipelined accumulating decoding, the use of accumulating decoding (e.g., even with pipelining) ensures that all of contributions of an APP (or gamma($\gamma$)) value are retained.

FIG. 12C illustrates an embodiment 1203 of accumulating decoding of an LDPC coded signal in which consecutive APP (a posteriori probability) (or gamma ($\gamma$)) update occurs properly. As a function of time (from left to right), the APP (or gamma($\gamma_i$)) value are fed into and passed out of registers and to appropriate check modules (e.g., shown as check a and check b in this embodiment) for check edge message updating. This embodiment may be viewed as being composed of an APP module or a gamma ($\gamma$) module (e.g., composed of the 2 subtractors, the adder, and the 3 registers compose the APP module or a gamma ($\gamma$) module) and a check module. Without performing pipeline accumulating decoding, it can be seen that the update of consecutive an APP (or gamma($\gamma$)) values are performed without problem. The accumulating decoding does include some additional adders, but this ensures that the contributions of an APP (or gamma($\gamma$)) value are retained thereby ensuring no performance loss.

FIG. 12D illustrates an embodiment 1204 of pipelined accumulating decoding of an LDPC coded signal in which contributions of various consecutive APP (a posteriori probability) (or gamma ($\gamma$)) updates are properly retained.

In this embodiment as well, as a function of time (from left to right), the APP (or gamma($\gamma_i$)) value are fed into and passed out of registers and to appropriate check modules (e.g., shown as check a and check b in this embodiment) for check edge message updating.

Because of the architecture and calculations employed in accordance with pipeline accumulating decoding (i.e., as in FIG. 12B), it can be seen that when the update of consecutive an APP (or gamma($\gamma$)) values is performed, each of the individual contributions are retained. For example, the contribution of the APP (or gamma ($\gamma$)) value from check a will not be included when performing the check b calculation, but this contribution is in fact included in subsequent calculations down the processing chain. In other words, the contribution of the APP (or gamma ($\gamma$)) value from check a is not lost (i.e., it is retained). Because of this, there is no undesirable performance loss when decoding LDPC coded signals using pipeline accumulating decoding.

In other words, the incremental changes in an APP (or gamma ($\gamma$)) value (e.g., $\Delta\gamma_1$, $\Delta\gamma_2$, etc.) are not lost but are retained and included for consideration in subsequent calculations. For example, in this embodiment, even if the incremental change as calculated in check a is not included during the calculation in check b, that incremental change is nonetheless added into the result generated by check b (e.g., as can be seen in the diagram).

FIG. 13 illustrates an embodiment 1300 of layered decoding of an LDPC coded signal in which an entire sub-matrix row is processed every decoding cycle. In accordance with layered decoding, an entire sub-matrix row is processed simultaneously at a time. Once that sub-matrix row is processed, then a subsequent sub-matrix row is processed, and so on throughout the entire LDPC matrix. As mentioned above and as can be seen in this diagram, a significant number of barrel shifters (BSs) are employed to ensure proper alignment of the APP (or gamma($\gamma$)) values when performing gamma ($\gamma$) update/calculation as well as performing check edge message updating (e.g., as in the X-input check modules). In this embodiment, X separate Y-way BSs are employed to ensure proper alignment of the outputs from the APP (or gamma ($\gamma$)) registers are properly provided to the X-input check modules. This embodiment may be viewed as being composed of APP or gamma ($\gamma$) modules and check modules (e.g., shown by the X-input check modules). The output there from, after passing through adders, is then again provided to X separate Y-way BSs to ensure proper alignment before being provided back to the APP (or gamma ($\gamma$)) registers as well as to the check edge message ($\lambda$) registers.

It is noted that the arithmetic footprint (i.e., the hardware, circuitry, connections, etc.) required in the layered decoding approach is correlated to the maximum computation resources required per cycle. In other words, the maximum required hardware needed to perform the computations is the measure that dictates the footprint (i.e., the hardware, circuitry, connections, etc.) required to perform layered decoding.

FIG. 14 illustrates an embodiment 1400 of pipelined/accumulating decoding of an LDPC coded signal in which multiple rows from various sub-matrix rows are processed every decoding cycle. In contradistinction to the previous embodiment, the pipelined/accumulating decoding approach presented herein allows for the footprint (i.e., the hardware, circuitry, connections, etc.) required to perform pipelined/accumulating decoding represents constant computations needed per cycle. This embodiment operates (e.g., as also depicted in FIG. 9) by processing multiple rows that span across multiple sub-matrix rows. As a reminder to the reader, the layered decoding approach operates on a sub-matrix row at a time, then proceeds to a next sub-matrix row, etc.

As can be seen in this embodiment, there is no need in the pipelined/accumulating decoding of FIG. 14 for the BSs that are needed within the layered decoding approach of FIG. 13.

It can be seen that some additional registers (depicted in bold face) are included to effectuate the pipelining of the accumulating decoding in this embodiment. In addition, one extra array of adders is included in this embodiment, but the accumulating decoding approach allows for the inclusion of each individual contribution of APP (or gamma ($\gamma$)) (i.e., changes in an APP (or gamma ($\gamma$)) value, $\Delta\gamma$).

Figure 15:
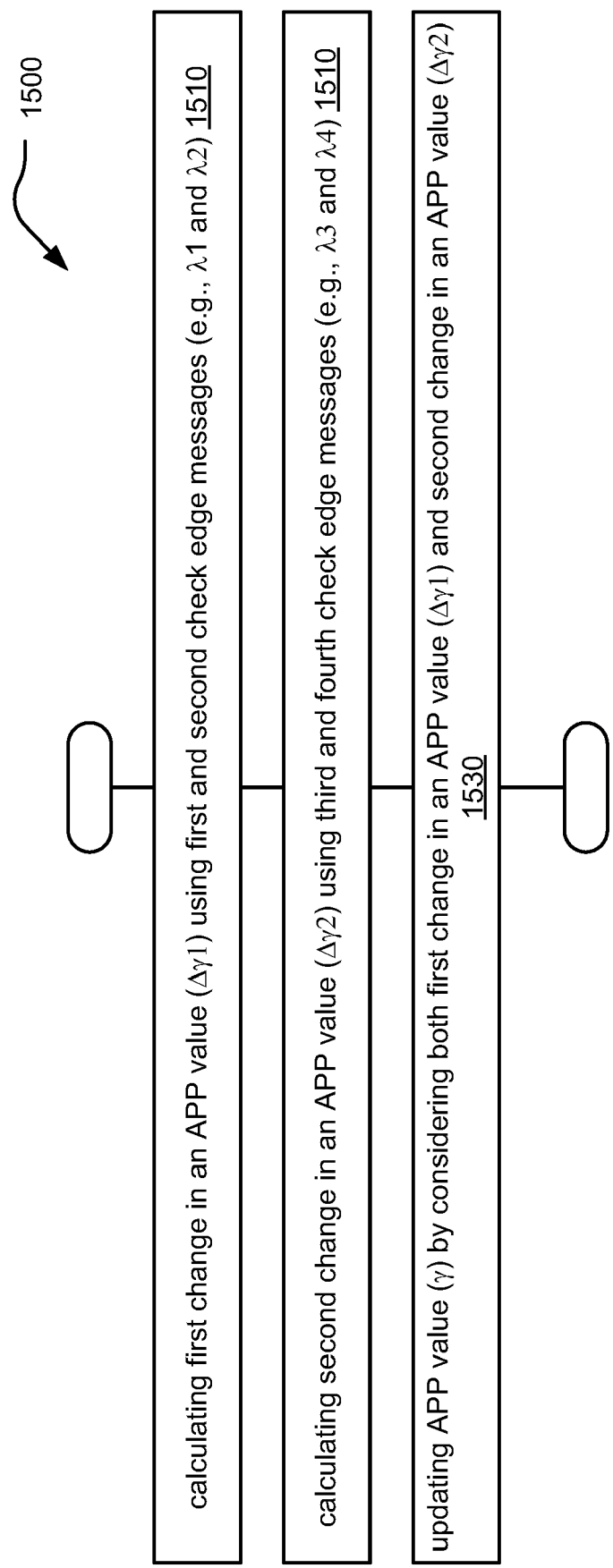
FIG. 15 illustrates an embodiment of a method for performing APP (a posteriori probability) (or gamma ($\gamma$)) update in accordance with accumulating decoding.

FIG. 15 illustrates an embodiment of a method 1500 for performing APP (a posteriori probability) (or gamma ($\gamma$)) update in accordance with accumulating decoding. The method 1500 begins by calculating a first change in an APP value (shown as $\Delta\gamma1$) using first and second check edge messages (e.g., $\lambda1$ and $\lambda2$), as shown in block 1510.

The method 1500 continues by calculating a second change in an APP value (shown as $\Delta\gamma2$) using third and fourth check edge messages (e.g., $\lambda3$ and $\lambda4$), as shown in block 1520. The method 1500 then operates by updating an APP value (shown as $\gamma$) by considering both the first change in the APP value (shown as $\Delta\gamma1$) and the second change in the APP value (shown as $\Delta\gamma2$), as shown in block 1530.

As can be seen, the accumulating decoding as presented herein provides a means by which the incremental changes in an APP (or gamma ($\gamma$)) value (e.g., $\Delta\gamma_1$, $\Delta\gamma_2$, etc.) are not lost but are retained and included for consideration in subsequent calculations.

The accumulating decoding architecture can be pipelined without incurring any coding gain and without incurring any reduction in performance. In contrast, the layered decoding approach, if pipelined, incurs a coding loss or a reduction in performance. The accumulating decoding architecture provides for increased throughput and a minimal size of the arithmetic footprint.

Also, the accumulating decoding architecture is more area efficient than the layered decoding approach. The accumulating decoding architecture provides for finer granularity in terms of parallelism. The arithmetic modules employed in the layered decoding approach that correspond to the null sub-matrices in each sub-matrix row (e.g., those all zero-valued sub-matrices) can be removed in the accumulating decoding approach. Moreover, the accumulating decoding approach can benefit from the use of daisy chains to store the APP (or gamma ($\gamma$)) values and/or the check edge message ($\lambda$) values, which significantly reduces the need for multiplexers, barrel shifters (BSs), and routing congestion inherent to the layered decoding approach.

This embodiment may be viewed as being composed of APP or gamma ($\gamma$) modules and check modules (e.g., shown by the pipelined check modules).

The use of daisy chains in accordance with the accumulating decoding architecture allows for the elimination of a level of multiplexing, in that, the data can be rotated or shifted via the daisy chained registers to feed the arithmetic units and store the results. Again, this obviates the need for a significant number of multiplexers, barrel shifters (BSs), and routing congestion that are inherent to the layered decoding approach.

Memory merging techniques can also be employed to reduce register count within the accumulating decoding approach.

The accumulating LDPC decoder architecture as described herein can be used in any a wide variety of application including those depicted with respect to FIG. 1, as well as certain wireless communication system applications such as those compliant with IEEE 802.11n, IEEE 802.16e, and emerging digital TV and wireless personal area network (WPAN) standards, etc.

Moreover, the accumulating decoder architecture can be generalized to more efficiently deal with multi-code applications such as those employed in communication systems that are IEEE 802.11n and IEEE 802.16e compliant. The layered decoder architecture does not provide this flexibility to deal with multi-code applications. When considering the superset (or superposition) of all codes that must supported, the accumulating architecture arithmetic can be tailored for each sub-matrix (or sub-block row) and the arithmetic calculations/updating corresponding to null sub-matrices (e.g., all zero-valued sub-matrices or sub-blocks) in each row can be removed when performing accumulating decoding. In contrast, the arithmetic for the layered decoding must be able to process as many non-null sub-matrices (or sub-blocks) in the worst case row (across all sub-matrix/sub-block rows) and hence no such hardware savings may be realized in the layered decoding approach.

It is noted that the various modules (e.g., encoding modules, decoding modules, etc.) described herein may be a single processing device or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. An apparatus, comprising:
an APP (a posteriori probability) module that is operative to:
calculate a change in a first APP value by subtracting a first check edge message from a second check edge message; and
update the first APP value by adding the first APP value to the change in the first APP value thereby generating a second APP value; and
a check module that is operative to employ the second APP value to update the second check edge message thereby generating a third check edge message; and wherein:
the APP module is operative to:
calculate a change in the second APP value by subtracting the second check edge message from the third check edge message; and
update the second APP value by adding the second APP value to the change in the second APP value thereby generating a third APP value; and
the apparatus is operative to employ the third APP value to make an estimate of an information bit encoded within an LDPC (Low Density Parity Check) coded signal.

2. The apparatus of claim 1, wherein the APP module further comprising:
a subtractor that is operative to calculate the change in the first APP value by subtracting the first check edge message from the second check edge message; and wherein:
the APP module is operative to employ the change in the first APP value to update the second APP value.

3. The apparatus of claim 1, further comprising:
a hard limiter that is operative to process the third APP value to make the estimate of the bit encoded within the LDPC coded signal.

4. The apparatus of claim 1, wherein the APP module further comprising:
an adder that is operative to add the first APP value to the change in the first APP value thereby generating the second APP value.

5. The apparatus of claim 1, wherein the APP module further comprising:
an adder that is operative to add the first APP value to the change in the first APP value thereby generating the second APP value;
a register having an input that is connected to an output of the adder and having an output that is connected to an input of the adder.

6. The apparatus of claim 1, wherein the APP module further comprising:
a subtractor that is operative to subtract the second APP value from the second check edge message thereby generating a difference between the second APP value and the second check edge message; and wherein:
the check module is operative to employ the difference between the second APP value and the second check edge message to update the second check edge message thereby generating the third check edge message.

7. The apparatus of claim 1, wherein:
the APP module is operative to update the first APP value by adding the first APP value to at least one additional change in the first APP value thereby generating the second APP value.

8. The apparatus of claim 1, wherein:
the APP module is operative to update the first APP value by adding the first APP value to the first APP value and at least one additional change in the first APP value thereby generating the second APP value.

9. The apparatus of claim 1, wherein:
the APP (a posteriori probability) module is one of a plurality of APP modules;
the check module is one of a plurality of check modules; and
the plurality of APP modules and the plurality of APP modules operate cooperatively to update process a plurality of sub-matrices of an LDPC matrix to make the estimate of the information bit encoded within the LDPC coded signal.

10. The apparatus of claim 1, wherein:
the apparatus is a wireless communication device.

11. The apparatus of claim 1, wherein:
the apparatus is a communication device;
the communication device is a transceiver or a receiver; and
the communication device is implemented within at least one of a satellite communication system, a wireless communication system, a wired communication system, and a fiber-optic communication system.

12. An apparatus, comprising:
an APP (a posteriori probability) module that includes:
a first subtractor that is operative to calculate a change in a first APP value by subtracting a first check edge message from a second check edge message; and
an adder, connected to the first subtractor, that is operative to update the first APP value by adding the first APP value to the change in the first APP value thereby generating a second APP value;
a register having an input that is connected to an output of the adder and having an output that is connected to an input of the adder; and
a second subtractor, connected to the register, that is operative to subtract the second APP value from the second check edge message thereby generating a difference between the second APP value and the second check edge message;
a check module that is operative to employ the difference between the second APP value from the second check edge message to update the second check edge message thereby generating the third check edge message; and
wherein:
the first subtractor of the APP module is operative to calculate a change in the second APP value by subtracting the second check edge message from the third check edge message; and
the adder of the APP module is operative to update the second APP value by adding the second APP value to the change in the second APP value thereby generating a third APP value; and
the apparatus is operative to employ the third APP value to make an estimate of an information bit encoded within an LDPC (Low Density Parity Check) coded signal.

13. The apparatus of claim 12, wherein:
the APP module is operative to update the first APP value by adding the first APP value to at least one additional change in the first APP value thereby generating the second APP value.

14. The apparatus of claim 12, wherein:
the APP module is operative to update the first APP value by adding the first APP value to the first APP value and at least one additional change in the first APP value thereby generating the second APP value.

15. The apparatus of claim 12, wherein:
the APP (a posteriori probability) module is one of a plurality of APP modules;
the check module is one of a plurality of check modules; and
the plurality of APP modules and the plurality of APP modules operate cooperatively to update process a plurality of sub-matrices of an LDPC matrix to make the estimate of the information bit encoded within the LDPC coded signal.

16. The apparatus of claim 12, wherein:
the apparatus is a communication device;
the communication device is a transceiver or a receiver; and
the communication device is implemented within at least one of a satellite communication system, a wireless communication system, a wired communication system, and a fiber-optic communication system.

17. A method, comprising:
employing an APP (a posteriori probability) module to calculate a change in a first APP value by subtracting a first check edge message from a second check edge message;
employing the APP module to update the first APP value by adding the first APP value to the change in the first APP value thereby generating a second APP value; and
employing a check module to employ the second APP value to update the second check edge message thereby generating a third check edge message;
employing the APP module to calculate a change in the second APP value by subtracting the second check edge message from the third check edge message;
employing the APP module to update the second APP value by adding the second APP value to the change in the second APP value thereby generating a third APP value; and
employing the third APP value to make an estimate of an information bit encoded within an LDPC (Low Density Parity Check) coded signal.

18. The method of claim 17, further comprising:
employing the APP module to update the first APP value by adding the first APP value to the first APP value and at least one additional change in the first APP value thereby generating the second APP value.

19. The method of claim 17, further comprising:
hard limiting the third APP value to make the estimate of the bit encoded within the LDPC coded signal.

20. The method of claim 17, wherein:
the method is performed within a communication device;
the communication device is a transceiver or a receiver; and
the communication device is implemented within at least one of a satellite communication system, a wireless communication system, a wired communication system, and a fiber-optic communication system.

* * * * *

UNITED STATES PATENT AND TRADEMARK OFFICE
CERTIFICATE OF CORRECTION

PATENT NO. : 8,341,488 B2  
APPLICATION NO. : 12/512490  
DATED : December 25, 2012  
INVENTOR(S) : Andrew J. Blanksby et al.

Page 1 of 1

It is certified that error appears in the above-identified patent and that said Letters Patent is hereby corrected as shown below:

In the Claims

Col. 20, line 31, in claim 8: after "by adding the first APP value" delete "to the first APP value"

Col. 20, lines 39-40, in claim 9: after "the plurality of APP modules" delete "and the plurality of APP modules"

Col. 21, line 27, in claim 14: after "by adding the first APP value" delete "to the first APP value"

Col. 21, lines 35-36, in claim 15: after "the plurality of APP modules" delete "and the plurality of APP modules"

Col. 22, line 28, in claim 18: after "adding the first APP value" delete "to the first APP value"

Signed and Sealed this  
Seventeenth Day of December, 2013

Margaret A. Focarino  
*Commissioner for Patents of the United States Patent and Trademark Office*